United States Patent
Sim et al.

(10) Patent No.: US 12,429,502 B2
(45) Date of Patent: Sep. 30, 2025

(54) PROBE ASSEMBLY FOR TEST AND BURN-IN HAVING A COMPLIANT CONTACT ELEMENT

(71) Applicant: KES SYSTEMS & SERVICE (1993) PTE LTD., Singapore (SG)

(72) Inventors: Hock Soon Sim, Singapore (SG); Zhiyun Ke, Singapore (SG)

(73) Assignee: KES SYSTEMS & SERVICE (1993) PTE LTD., Singapore (SG)

( * ) Notice: Subject to any disclaimer, the term of this patent is extended or adjusted under 35 U.S.C. 154(b) by 0 days.

(21) Appl. No.: 17/716,094

(22) Filed: Apr. 8, 2022

(65) Prior Publication Data

US 2022/0326280 A1 Oct. 13, 2022

Related U.S. Application Data

(60) Provisional application No. 63/173,852, filed on Apr. 12, 2021.

(51) Int. Cl.
G01R 1/073 (2006.01)
G01R 1/067 (2006.01)

(52) U.S. Cl.
CPC ..... *G01R 1/07357* (2013.01); *G01R 1/06738* (2013.01)

(58) Field of Classification Search
CPC ............ G01R 1/07357; G01R 1/07328; G01R 1/07314; G01R 1/07307; G01R 1/073;
(Continued)

(56) References Cited

U.S. PATENT DOCUMENTS

| 5,952,843 A | 9/1999 | Vinh |
| 6,150,830 A | 11/2000 | Schmid et al. |

(Continued)

FOREIGN PATENT DOCUMENTS

| CN | 109425763 A | 3/2019 |
| EP | 0068270 A1 | 1/1983 |

(Continued)

OTHER PUBLICATIONS

International Search Report and Written Opinion for International Application No. PCT/SG2018/050143 dated Jun. 26, 2018 (10 pages).

(Continued)

*Primary Examiner* — Judy Nguyen
*Assistant Examiner* — James Split
(74) *Attorney, Agent, or Firm* — Botos Churchill IP Law LLP

(57) ABSTRACT

A vertical probe assembly having a resilient compliant probe, a first guide plate, a second guide plate, and a third guide plate is disclosed. The probe may include an upper portion, a lower portion, and a stopper structure positioned between the upper and lower portions of the first probe. The first, second, and third guide plates may be formed from a non-conductive substrate and separated by one or more spacers. The first, second, and third guide plates may also include a first, second, and third hole, respectively. The first, second, and third holes may be vertically aligned. The probe may be positioned within the first, second, and third holes such that the upper portion extends through the first hole, the lower portion extends through the second and third holes, and the stopper structure contacts a surface of the second guide plate that faces the first guide plate.

17 Claims, 22 Drawing Sheets

(58) Field of Classification Search
CPC ............ G01R 1/07378; G01R 1/07371; G01R 1/07364; G01R 1/0675; G01R 1/06733; G01R 1/06738; G01R 1/067; G01R 1/06716; G01R 1/06711; G01R 1/06727; G01R 1/06722; G01R 1/07342; G01R 31/2891; G01R 31/2886
See application file for complete search history.

(56) References Cited

U.S. PATENT DOCUMENTS

| | | | | |
|---|---|---|---|---|
| 6,255,832 | B1* | 7/2001 | Notohardjono | G01R 1/07357 324/750.25 |
| 6,356,090 | B2 | 3/2002 | Deshayes | |
| 6,529,021 | B1 | 3/2003 | Yu et al. | |
| 6,676,438 | B2* | 1/2004 | Zhou | H01R 13/2435 439/482 |
| 6,768,327 | B2* | 7/2004 | Felici | G01R 1/06716 324/755.06 |
| 9,658,250 | B2* | 5/2017 | Hsieh | G01R 1/07357 |
| 10,060,949 | B2* | 8/2018 | Li | G01R 1/07371 |
| 10,613,117 | B2* | 4/2020 | Chen | G01R 1/06733 |
| 11,022,627 | B2* | 6/2021 | Nasu | G01R 1/06722 |
| 2002/0153910 | A1 | 10/2002 | Felici et al. | |
| 2004/0135594 | A1 | 7/2004 | Beaman et al. | |
| 2007/0017702 | A1 | 1/2007 | Schmid et al. | |
| 2008/0054919 | A1 | 3/2008 | Wu et al. | |
| 2008/0150564 | A1 | 6/2008 | Schmid et al. | |
| 2009/0315578 | A1 | 12/2009 | Lou | |
| 2014/0352460 | A1 | 12/2014 | Kuo et al. | |
| 2018/0003767 | A1 | 1/2018 | Crippa et al. | |
| 2019/0293686 | A1 | 9/2019 | Crippa et al. | |
| 2020/0025797 | A1 | 1/2020 | Nasu | |

FOREIGN PATENT DOCUMENTS

| | | |
|---|---|---|
| EP | 0503810 A2 | 9/1992 |
| EP | 2984492 B1 | 2/2016 |
| JP | H0921828 A | 1/1997 |
| JP | 2013257299 A | 12/2013 |
| WO | 2010095521 A1 | 8/2010 |
| WO | 2016177850 A1 | 11/2016 |
| WO | 2018186802 A1 | 10/2018 |

OTHER PUBLICATIONS

Supplementary European Search Report issued in corresponding European Application No. 18780413.3 dated Dec. 3, 2020, (9 pages).

Partial European search report for corresponding EP Application No. 22167266.0-1001 dated Aug. 26, 2022 (20 pages).

Office Action for European Patent Application No. 22167266.0, Feb. 13, 2025, 7 Pages.

* cited by examiner

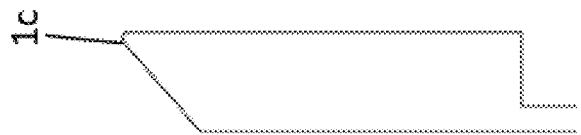
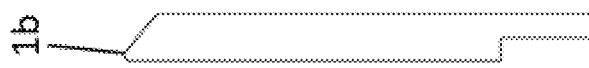
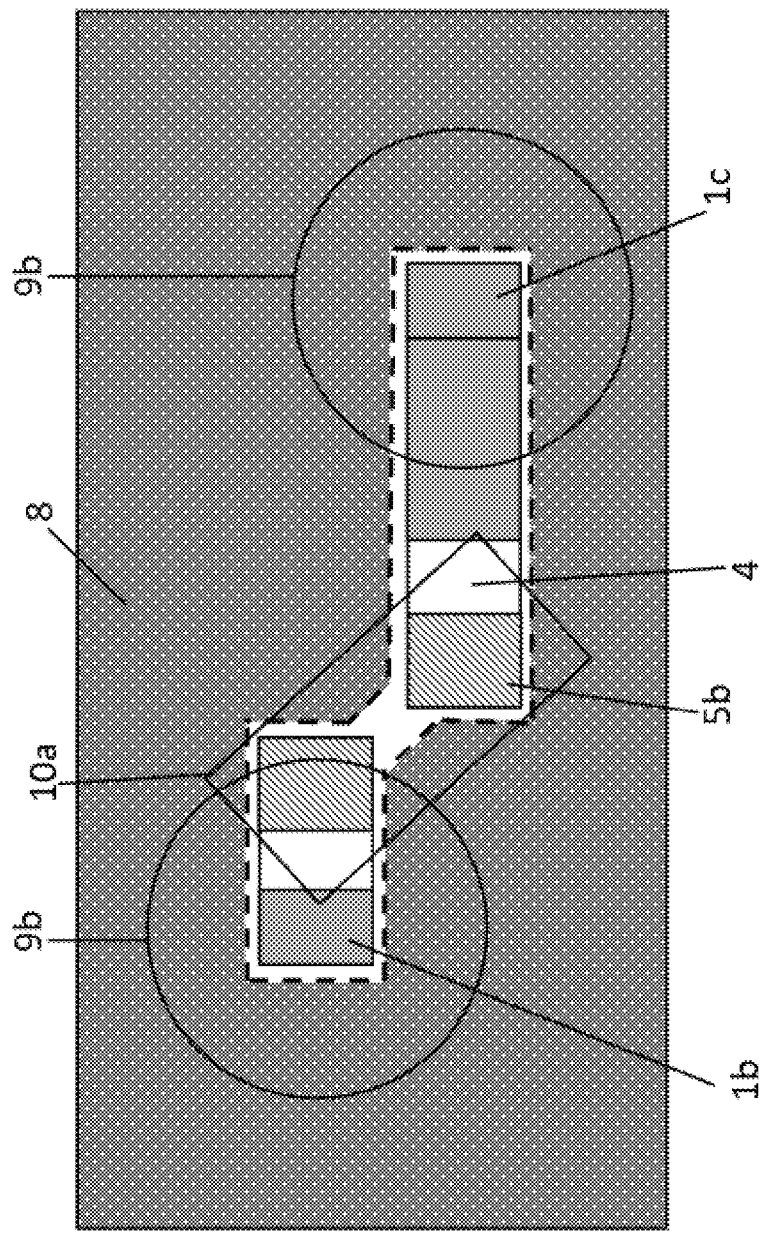
FIG. 11(c)
FIG. 11(b)
FIG. 11(a)

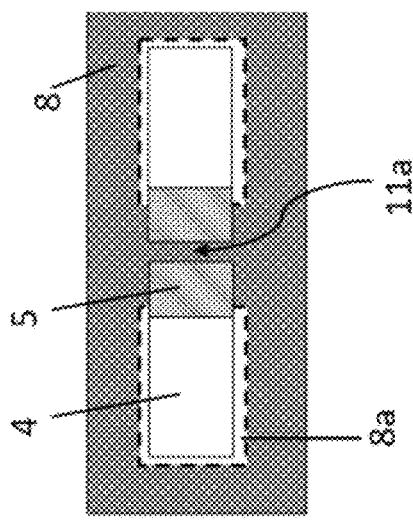
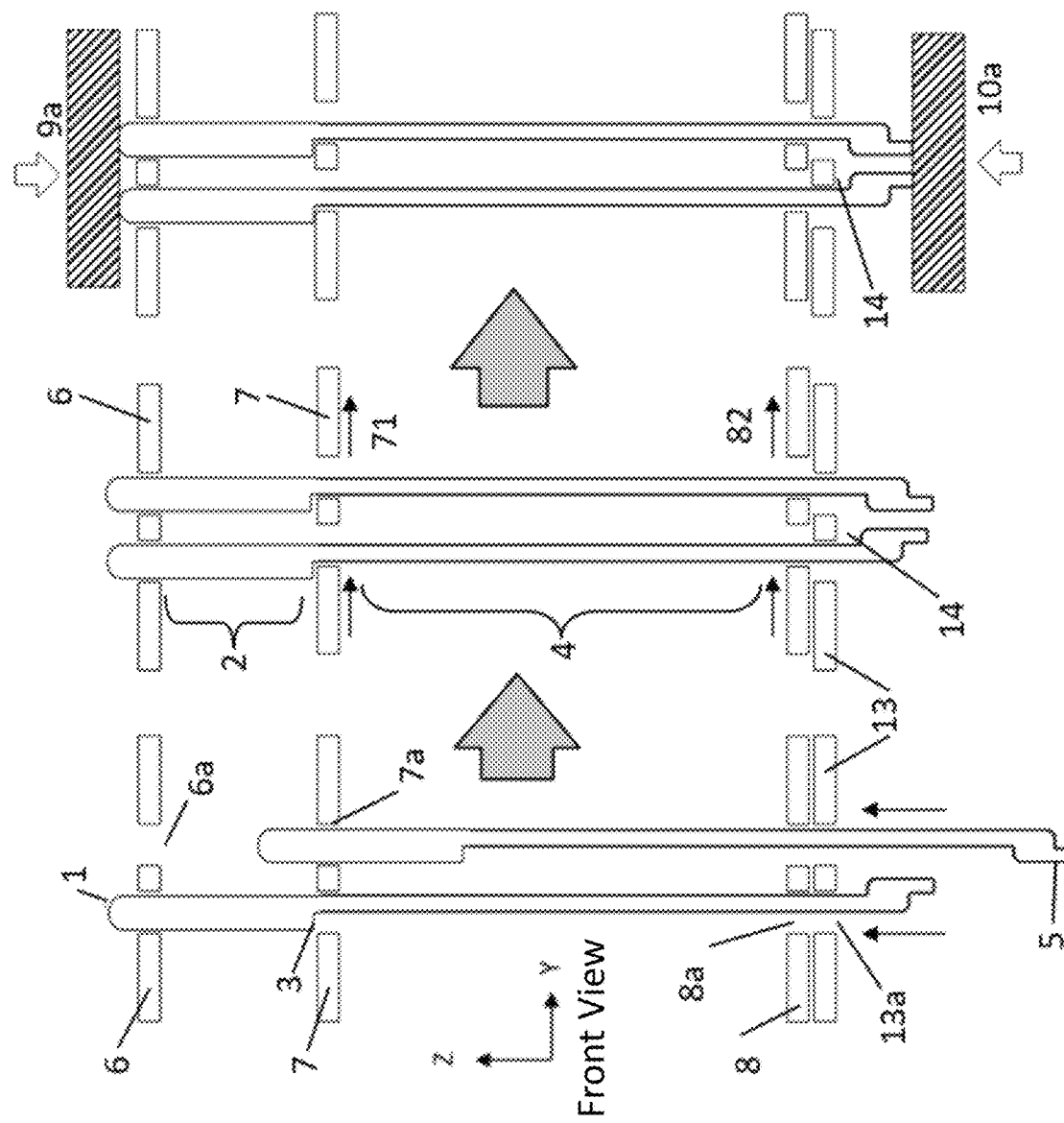
FIG. 12(b)
FIG. 12(a)

PROBE ASSEMBLY FOR TEST AND BURN-IN HAVING A COMPLIANT CONTACT ELEMENT

CROSS REFERENCE TO RELATED APPLICATIONS

This application claims the benefit of the filing date of U.S. Provisional Patent Application No. 63/173,852 filed Apr. 12, 2021, and is related to U.S. application Ser. No. 16/500,281, filed Mar. 28, 2018, which is a national stage entry of International Application No. PCT/SG2018/050143, filed on Mar. 28, 2018, which claims priority from U.S. Provisional Application No. 62/480,882, filed Apr. 3, 2017, all of which are incorporated by reference herein.

BACKGROUND

Wafers containing thousands to a few hundred thousand integrated circuit die are subjected to various electrical tests. These electrical tests are designed to identify bad die on the wafer prior to singulation into individual die and insertion into final package. Examples of such packages include a quad flat package (QFP), a quad flat no lead package (QFN), a ball grid array (BGA), and a wafer level chip scale package (WLCSP). The separation of good and bad individual die is carried out in a wafer sort test system.

A typical wafer sort test system (e.g., within a test cell) includes a tester for generating various electrical test signals, a test head for receiving and transferring the test signals from the tester, a prober interface board for receiving and transferring the test signals from the test head, and a probe card for receiving and transferring the test signals from the prober interface board. The probe card may be used to make temporary electrical contact with a wafer. A wafer prober may be used to position the wafer relative to the probe card.

During a wafer sort test, the tester generates and measures various electrical test signals that consist of specific combinations of voltage, current, and frequency. These electrical test signals are transmitted from the tester to the test head, to the prober interface board, to the probe card and then to one or more integrated circuits on the wafer. The integrated circuit response to electrical signals, such as voltage, current, and frequency, are measured, analyzed, and compared by the tester. These electrical values received from a specific integrated circuit that do not meet a specification will be identified as "bad" in the software.

Probe cards may include a printed circuit board (PCB) or space transformer and a probe head (referred to herein as a probe assembly) that contains contact elements, such as probes, for making temporary electrical contact with the contact pads on the wafer (i.e., the device under test (DUT)) and contact pads on the PCB or space transformer. During operation, the wafer prober may align the X-Y position of a wafer die with the probe card's X-Y position prior to the start of any electrical test. The wafer prober may then raise the wafer towards the probe card in a positive Z-direction until the probes touch the contact pads of the wafer die. The wafer prober may then apply an overdrive force and raise the wafer a further distance (e.g., a few more millimeters in a positive Z-direction) to make sure all the probes are brought into contact with the respective contact pads of the wafer die with sufficient force. Sufficient force is adequate force to ensure good electrical contact between the probes and the wafer contact pads. Also, during operation, the probes are brought into contact with the contact pads on the PCB or space transformer. Once an electrical test is completed on a particular wafer die, the wafer is stepped in sequence to the rest of the untested die on the wafer.

One problem that arises in electrical test assemblies is that the die pad surface on the wafer typically has a layer of metal oxide formed thereon by oxidation from the reaction with air. This metal oxide layer adversely affects the conductance of electricity because it presents a high electrical contact resistance during electrical testing. To ensure accurate electrical test results, this layer of oxide must be penetrated to expose the underlying metal.

To penetrate the oxide layers, the probes should be placed into contact with the electrical contacts on the wafer with an amount of force (e.g., an amount of gram force, newtons, etc.) that will allow the probes to penetrate or punch through the oxide layer of the electrical contact and into contact with the underlying metal surface. If the force is too little, the probes may not punch through the oxide completely. Furthermore, some of the probes may become burnt (e.g., from increased current flowing through a fewer number of probes). However, too much force may cause the metal contact pad to crack. In current test apparatus, the operator can reduce the contact force by reducing the overdrive force (e.g., in a Z-direction), but such adjustments may be at the expense of co-planarity of the probe head and the wafer (and therefore non-uniform contact between the plurality of the probes and the plurality of contact pads). The contact force between the probes and the contact pads is pre-determined during design of the apparatus and built into the probe assembly when manufactured.

Vertical probe assemblies may have upper guide plates and lower guide plates with holes for receiving the probes and maintaining a vertical orientation of the probes. Probes produced from wire, such as wire probes or cobra probes, are placed and configured so that the probes are not initially in electrical contact with the die pads on the wafer or the contact pads on the PCB or space transformer. The probe therefor remains suspended freely in the probe assembly until the probe makes contact with the wafer contact pads or the contact pads of the printed circuit board or space transformer. While the contact pads on the device under test are only contacted once by a probe, the contact pads on the PCB or space transformer are contacted repeatedly. Therefore, contacting the PCB or space transformer contact pads repeatedly using significant contact force can cause these contact pads to wear out prematurely. Once a contact pad is significantly worn out, an open circuit can result.

Solutions to the problems described above (e.g., using significant, repeated contact force to bring the probes into contact with the contact pads) are sought.

BRIEF SUMMARY

One aspect of the present disclosure relates to a vertical probe assembly that includes a first resilient compliant probe formed from a conductive material, a first guide plate having a first hole, a second guide plate having a second hole, and a third guide plate having a third hole. The first probe may include an upper portion, a lower portion, and a stopper structure positioned between the upper and lower portions of the first probe. The second guide plate may be positioned beneath the first guide plate. The third guide plate may be positioned beneath the first and second guide plates. The first, second, and third guide plates may be formed from a non-conductive substrate and separated by one or more spacers. The first, second, and third holes may be vertically aligned. The first probe may be positioned within the first, second, and third holes such that the upper portion extends through the first hole, the lower portion extends through the second and third holes, and the stopper structure contacts a surface of the second guide plate that faces the first guide plate.

In some implementations, the stopper structure is a flange that extends laterally beyond the second hole. In some implementations, a tip of the first probe is offset. In some implementations, a tip of the first probe is symmetrical. In some implementations, the upper and lower portions of the first probe are configured to separately deform in response to external forces being applied to proximal and distal ends of the first probe. In some implementations, the upper and lower portions of the first probe have square or rectangular cross sections. In some implementations, the lower portion of the first probe is curved.

In some implementations, the vertical probe assembly further includes a second resilient compliant probe that extends through the first, second, and third holes without contacting the first probe. In some implementations, the first and second probes may each include a distal end for contacting a wafer during electrical testing of the wafer. In such implementations, the distal ends of the first and second probes may be oppositely oriented.

In some implementations, the vertical probe assembly further includes a fourth guide plate having a fourth hole. The fourth guide plate may be positioned beneath the first, second, and third guide plates. The fourth guide plate may be formed from a non-conductive substrate and separated from the third guide plate by one or more spacers. The fourth hole may be vertically aligned with the first, second, and third holes. In such implementations, the lower portion of the first probe may extend through the fourth hole. Furthermore, in such implementations, at least two of the first, second, third, and fourth guide plates may be configured to slide horizontally to release or secure the first probe.

Another aspect of the present disclosure relates to a probe assembly having at least two guide plates, each guide plate formed from a non-conductive substrate. The guide plates have a first and second surface with an array of holes extending from the first surface to the second surface. The holes of the guide plates align to receive therethrough a resilient compliant probe. The resilient compliant probe has a proximal end and a distal end. The proximal and distal ends extend beyond the holes of the guide plates. The probes are patterned. The pattern includes a plurality of fingers at the proximal end, wherein at least a first finger is longer than a second finger. The probe further includes a junction from which the fingers extend toward the proximal end of the probe. The distal end of the probe does not have fingers. The distal end of the probe can terminate in a flat surface or a pointed surface. The distal end of the probe may also have a tapered surface or a curved or lobed portion that forms the distal end of the probe.

In some implementations, the probe assembly has curved fingers. In some implementations, at least one finger has a stopper structure that prevents the entire probe from passing through the hole in the guide plate in which the probe is received. For example, the finger may have a flange portion that extends laterally from the finger, providing an increased width portion of the finger that prevents the finger from passing entirely through a hole. In some implementations, the first and second guide plates are fixed in position.

In some implementations, the resilient compliant probe is formed from a conductive material or a composite of conductive materials. Suitable conductive materials include silver-copper alloy, platinum alloy, palladium alloy, copper, gold, rhodium, nickel, nickel alloy, graphene, and carbon nanotube composites.

In a method for operation of the probe assembly, a plurality of contacts are brought into electrical contact with contacts disposed on a printed circuit board or space transformer into engagement with a corresponding plurality of the resilient compliant probes. The force of contact causes at least the longer finger of the probe to bend in response to the force exerted thereon by the printed circuit board.

BRIEF DESCRIPTION OF DRAWINGS

FIG. 11(a) is a bottom-up view from a wafer of two different types of probes positioned in a single hole of a guide plate.

FIG. 11(b) illustrates a proximal end of one of the probes illustrated in FIG. 11(a).

FIG. 11(c) illustrates a proximal end of one of the probes illustrated in FIG. 11(a).

FIG. 12(a) illustrates a method for assembling and using a probe assembly in which the probes are tightly arranged.

FIG. 12(b) is a bottom-up view from a wafer of the probes illustrated in FIG. 12(a).

DETAILED DESCRIPTION

Figure 1:
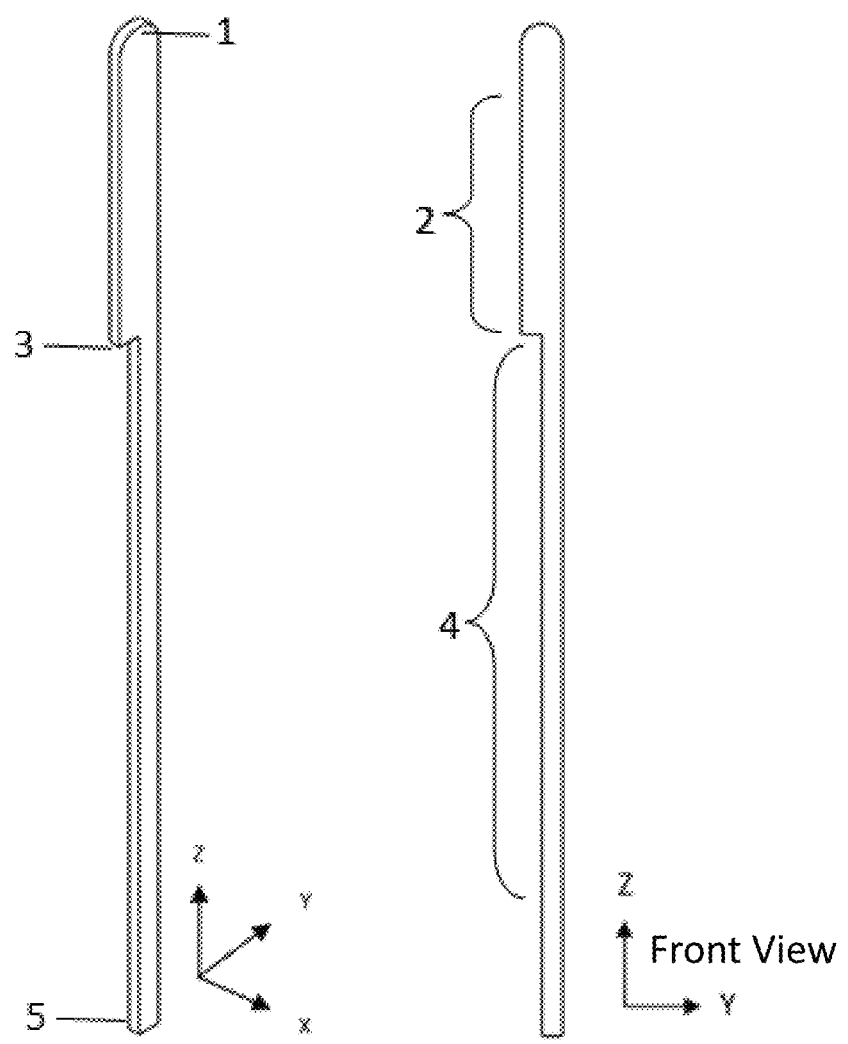
FIG. 1 illustrates an isometric view and a front view of a probe according to one implementation.

Implementations of the present disclosure are described in detail with reference to the drawing figures wherein like reference numerals identify similar or identical elements. It is to be understood that the disclosed implementations are merely examples of the disclosure, which may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure.

Various electrically conductive probes for use in a probe assembly are described herein. The probes may be patterned structures that are resiliently compliant. The probes have a proximal end and a distal end. During operation, the proximal end of a probe is placed into engagement with a contact on a PCB or space transformer, and the distal end of the probe is placed into engagement with a contact on a wafer (i.e., a DUT).

The probe assembly may have a plurality of guide plates (e.g., three plates). The guide plates may be formed from an electrically non-conductive (i.e., electrically insulating) material, such as ceramic, plastic, glass, fused silica, etc. Each guide plate forms a plane with a plurality of holes therethrough forming an array of holes. The holes in the guide plates may be aligned vertically so that the electrically conductive probes can be held in the holes in the guide plates and extend therethrough. The holes may be square, rectangular, circular, or have any shape suitable for receiving the probes. During manufacturing, the holes may be formed through an etching and/or a laser drilling process. The guide plates are held at a distance defined by one or more spacers. Such spacers are conventional and well known to one skilled in the art. Therefore, the spacers are not described in detail herein. The spacers may be formed from any structurally suitable material, such as plastic. The spacers may also include layers of plastic and/or metal.

As noted above, each of the plurality of electrically conductive probes may be compliant, so that only the necessary force that is required for acceptable electrical contact is applied by the probe to an electrical contact (e.g., a contact on a PCB or space transformer and/or a contact of a wafer). For example, the probes may have some degree of resilient compliance such that, in response to a predetermined load placed on the probe when advanced into electrical connectivity with an electrical contact, the probe will deform, which limits or mitigates the amount of force that the probe can apply to the electrical contact. During operation, the probe assembly may be preloaded. For example, before the distal ends of any of the probes are placed into engagement with the contact pads on a wafer, the proximal ends of the probes may be placed into engagement with the contact pads on a PCB or space transformer. After preloading the probe assembly, an upper portion of each of the probes may deform. Furthermore, after contacting a wafer during testing, a lower portion of each of the probes may deform.

The electrically conductive probes may be constructed from a homogenous alloy, such as silver-copper alloy, platinum alloy, palladium alloy, etc., or a composite of different layers of materials, such as copper, gold, rhodium, nickel, nickel alloy, graphene, carbon nano tube, etc. Material selection will depend on the electrical and mechanical strength probe requirements. In some implementations, the fabrication process of such probes may include, for example, laser cutting a metal foil or sheet and/or additive manufacturing methods, such as electroforming, covalent bonding, and/or etching. In some implementations, after one or more such processes, the fabrication process may also include adding one or more layers of materials to the probes while they rest on one or more flat horizontal surfaces. These manufacturing techniques may be used to produce probes having, for example, square and/or rectangular cross sections. During manufacturing, the probes may also be stamped to form a curved portion. In some implementations, the probes may be formed using Micro-Electro-Mechanical Systems (MEMS) manufacturing techniques. In some implementations, the probes may be coated with one or more layers of electrically insulating materials, such as acrylic, polyimides, parylene, and/or any other electrically insulating materials.

In some implementations, each of the electrically conductive probes may include a stopper structure to retain the probes in the probe assembly while also permitting the probes to deform in the manner described herein. A stopper structure may have a lateral dimension that is larger than the hole in a guide plate. This ensures that the corresponding probe is retained in the guide plate. In one implementation, the stopper structure is a flange that extends laterally past the hole of the guide plate into which the corresponding probe has been inserted. Since the flange cannot pass through the hole, the probe may be held in the probe assembly. As a result, the flange prevents the probe from falling through the guide plate when there is nothing beneath the probe assembly that would prevent the probe from otherwise passing through the hole in the guide plate and falling out of the probe assembly (e.g., from gravity and/or a force applied to a proximal end of the probe through a PCB or space transformer).

In some implementations, the spaces between the electrically conductive probes may be reduced. For example, two or more holes in a guide plate may be combined to form a single hole through which two or more probes are placed. As another example, the probes may include offset tips. Two probes with offset tips can be placed closer together (relative to two probes without offset tips) when oriented in opposite directions relative to one another. The distance between two oppositely oriented probes with offset tips may be even further reduced by shifting at least some of the guide plates. These types of configurations may be particularly advantageous when a Kelvin test must be performed on a wafer. Furthermore, these types of configurations may advantageously permit an increased amount of current to be delivered to a wafer's contact pads.

In some implementations, the electrically conductive probes may include at least two fingers, one of which is longer than the other. The fingers may extend to the proximal end of the electrically conductive probe. The fingers are spaced apart, and the finger dimensions impart the resilient compliance to the probes. In such implementations, the distal end of the probe may not have any fingers. Instead, the distal end may terminate in a variety of different configurations. For example, the distal end can terminate in a pointed tip, a curved tip, a tapered tip, or a flat tip. A lobe-sided tip, as used herein, is a tip that extends laterally from the probe end. Pointed tips may be deployed to provide good contact with the contact pad of a wafer, while flat tips may be deployed to contact solder bumps or copper pillar bumps on the wafer.

FIG. 1 illustrates an isometric view and a front view of a probe having a proximal end 1, an upper portion 2, a stopper structure 3, a lower portion 4, and a distal end 5. When positioned in a vertical probe assembly, stopper structure 3 prevents the probe of FIG. 1 from falling through a guide plate when there is nothing beneath the probe assembly that would prevent the probe from otherwise passing through a hole in the guide plate and falling out of the probe assembly. During operation, proximal end 1 is placed into engagement with a contact on a PCB or space transformer, and distal end 5 is placed into engagement with a contact on a wafer. In some implementations, the probe of FIG. 1 may be pre-loaded. For example, before distal end 5 is placed into engagement with a contact pad on a wafer, proximal end 1 may be placed into engagement with a contact pad on a PCB or space transformer. After preloading, upper portion 2 may deform. Furthermore, after contacting the wafer, lower portion 4 may deform.

The probe of FIG. 1 may be constructed from a homogenous alloy, such as silver-copper alloy, platinum alloy, palladium alloy, etc., or a composite of different layers of materials, such as copper, gold, rhodium, nickel, nickel alloy, graphene, carbon nano tube, etc. Material selection will depend on the electrical and mechanical strength probe requirements. In some implementations, the probe of FIG. 1 may be manufactured from, for example, a metal foil or sheet through laser cutting and/or additive manufacturing methods, such as electroforming, covalent bonding, and/or etching. In such implementations, after the laser cutting, one or more layers of materials may be added to the probe of FIG. 1 while it rests on a flat horizontal surface. In some implementations, the probe of FIG. 1 may be formed using Micro-Electro-Mechanical Systems (MEMS) manufacturing techniques. In some implementations, the probe of FIG. 1 may be coated with one or more layers of electrically insulating materials, such as acrylic, polyimides, parylene, and/or any other electrically insulating materials.

Figure 2A:
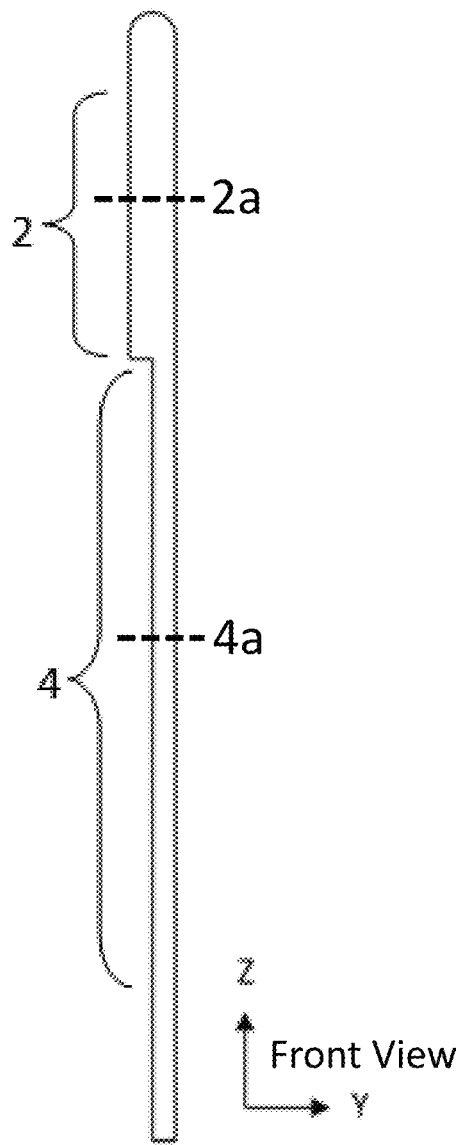
FIG. 2(a) is a front view of the probe of FIG. 1.
Figure 2B:
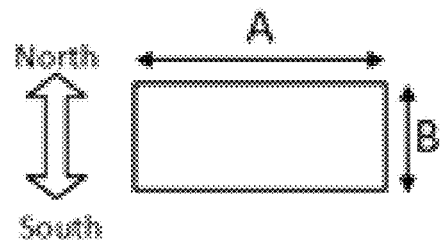
FIG. 2(b) is a cross-sectional view of the probe of FIG. 1 alongside an illustration of possible directions of deformation.
Figure 2C:
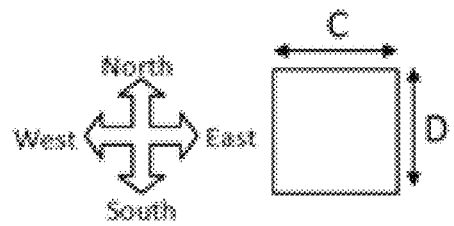
FIG. 2(c) is a cross-sectional view of the probe of FIG. 1 alongside an illustration of possible directions of deformation.

FIGS. 2(a)-(c) illustrate a front view of the probe of FIG. 1 and cross-sectional views of that probe alongside illustrations of possible directions of deformation. FIG. 2(b) is a cross section taken at line 2a. As shown, this cross-section is rectangular and has a width A and a length B. Since width A is greater than length B and upper portion 2 has a relatively uniform cross section, upper portion 2 will tend to bend or deflect in the illustrated north and south directions in response to an external force applied in a positive or negative Z-direction. FIG. 2(c) is a cross section taken at line 4a. As shown, this cross-section is square and has a width C and a length D. Since width C is equal to length D and lower portion 4 has a relatively uniform cross section, lower portion 4 will tend to bend or deflect in the illustrated north, south, east, and west directions in response to an external force applied in a positive or negative Z-direction.

The amount of force applied by the proximal and distal ends of the probe illustrated in FIGS. 1-2(c) to the contact pads of the PCB or space transformer and the wafer, respectively, depends on dimensions A, B, C, and D, the type of material used to construct the probe, and the buckling distance. Such calculations are conventional and well known to one skilled in the art. Therefore, these calculations are not described in detail herein.

Figure 2D:
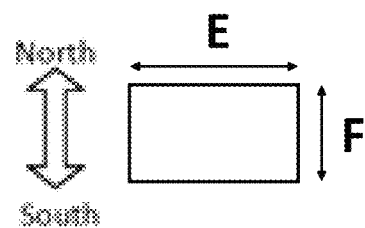
FIG. 2(d) is a cross-sectional view of the probe of FIG. 1 alongside an illustration of possible directions of deformation.

In other implementations, the probe of FIG. 1 may be shaped differently. For example, the cross section taken at line 4a may be rectangular instead of square. For example, as shown in FIG. 2(d), the cross section taken at line 4a may be rectangular and have a width E and a length F. Since width E is greater than length F and lower portion 4 has a relatively uniform cross section, lower portion 4 will tend to bend or deflect in the illustrated north and south directions in response to an external force applied in a positive or negative Z-direction. Furthermore, in such implementations, width E may be less than width A of FIG. 2(b).

Figure 3:
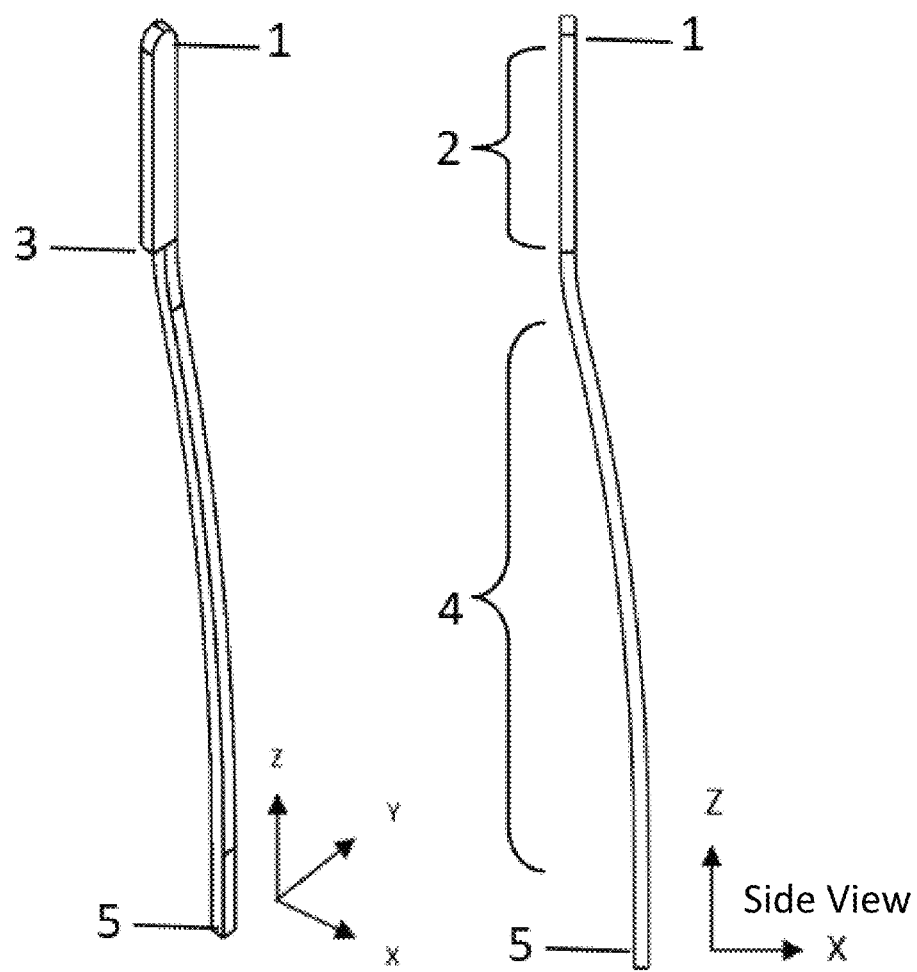
FIG. 3 illustrates an isometric view and a front view of a curved probe according to one implementation.

FIG. 3 illustrates an isometric view and a front view of a modified version of the probe described above in relation to FIGS. 1-2(c). In FIGS. 1-2(c), upper portion 2 and lower portion 4 are straight. However, in FIG. 3, upper portion 2 is straight and lower portion 4 is curved. In some implementations, lower portion 4 may be curved during manufacturing through a stamping process. The curve of lower portion 4 may allow it to more easily compress when an external force is applied in a positive or negative Z-direction, which will reduce the amount of force that distal end 5 applies to a contact pad on a wafer during testing.

Figure 4:
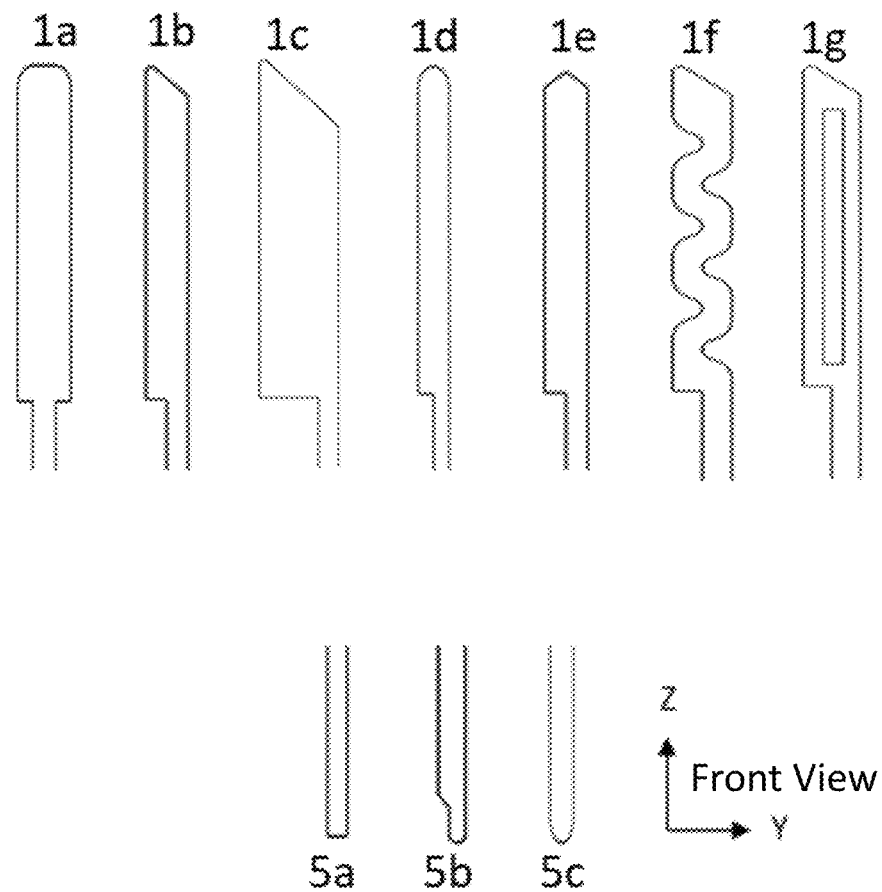
FIG. 4 illustrates alternative tip designs that may replace the proximal and/or distal ends of the probe of FIG. 1.

FIG. 4 illustrates some alternative tip designs that may replace the proximal and/or distal ends of the probes described above in relation to FIGS. 1-3. For example, the proximal and/or distal ends of these probes may include one or more cutouts and/or have a variety of different shapes. As shown, proximal end 1d may be compared to proximal end 1, and distal end 5a may be compared to distal end 5. Any of proximal ends 1a, 1b, 1c, 1e, 1f, or 1g can replace proximal end 1 of FIGS. 1-3. Furthermore, either of distal ends 5b or 5c can replace distal end 5 of FIGS. 1-3. As noted above, pointed tips may be deployed to provide good contact with the contact pad of a wafer, while flat tips may be deployed to contact solder bumps or copper pillar bumps on the wafer. As shown, proximal ends 1b, 1c, 1e, 1f, and 1g are more pointed than, for example, proximal ends 1a and 1d. Furthermore, distal ends 5b and 5c are more pointed than, for example, distal end 5a. As noted above, offset tips can be used to reduce the space between probes. As shown, proximal ends 1b, 1c, 1f, and 1g have offset tips, whereas the tips of proximal ends 1a, 1d, and 1e are symmetrical. Furthermore, distal end 5b has an offset tip, whereas the tips of distal ends 5a and 5c are symmetrical.

Additional modifications of the probes described above in relation to FIGS. 1-3 are also envisioned. For example, in the implementations described above, upper portion 2 is shorter than lower portion 4. However, in some implementations upper portion 2 and lower portion 4 may have approximately the same length. Furthermore, in some implementations, upper portion 2 may be longer than lower portion 4. As another example, in the implementations described above, the cross sections of the probes are either square or rectangular. However, these cross sections may be circular, elliptical, or have a variety of different shapes. As described above in relation to FIGS. 2(a)-(d), the square and rectangular cross sections merely provide additional control over the directions in which upper portion 2 and lower portion 4 bend or buckle. For example, if upper portion 2 and lower portion 4 both have rectangular cross sections, the deformation of these portions may be generally limited to two directions (e.g., north and south).

Figure 5A:
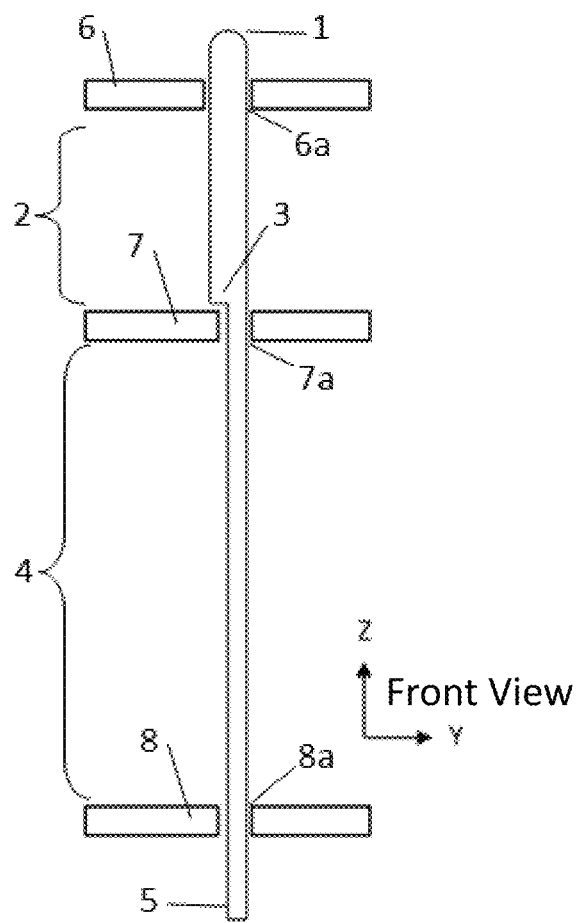
FIG. 5(a) is a front view of the probe of FIG. 1 positioned in three guide plates.
Figure 5B:
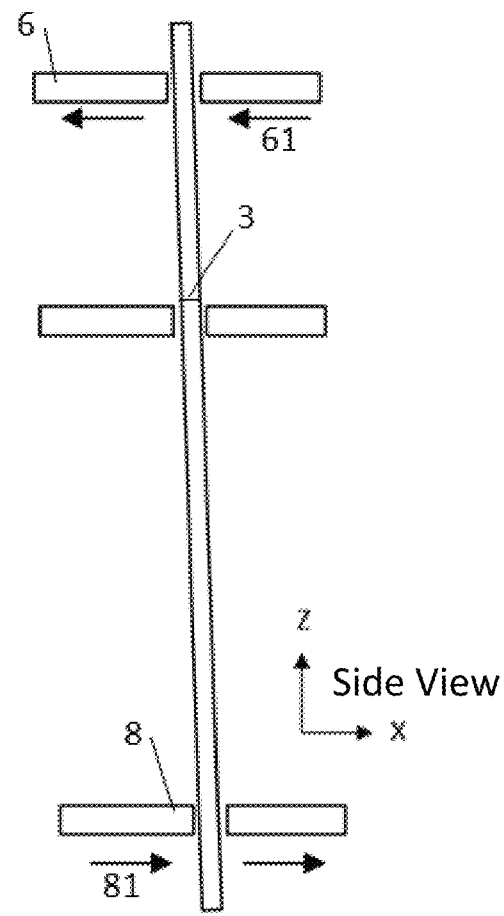
FIG. 5(b) is a side view of the probe of FIG. 1 positioned in three guide plates.

FIGS. 5(*a*)-(*b*) illustrate a front view and a side view of the probe of FIGS. 1-2(*c*) positioned in an upper guide plate 6, a middle guide plate 7, and a lower guide plate 8 of a probe assembly. Guide plates 6, 7, and/or 8 may be formed from an electrically non-conductive (i.e., electrically insulating) material, such as ceramic, plastic, glass, fused silica, etc. The guide plates are held apart by one or more spacers. As shown, the spacing between upper guide plate 6 and middle guide plate 7 is smaller than the spacing between middle guide 7 and lower guide plate 8. The spacers may be formed from any structurally suitable material, such as plastic. The spacers may also include layers of plastic and/or metal. As shown, upper guide plate 6 includes a hole 6*a*, middle guide plate 7 includes a hole 7*a*, and lower guide plate 8 includes a hole 8*a*. Holes 6*a*, 7*a*, and 8*a* may be etched or laser drilled into guide plates 6, 7, and 8, respectively. As shown, holes 6*a*, 7*a*, and 8*a* are vertically aligned so that the probe of FIGS. 1-2(*c*) can be held in holes 6*a*, 7*a*, and 8*a* and extend therethrough.

During assembly, the probe of FIGS. 1-2(*c*) may be lowered into holes 6*a*, 7*a*, and 8*a*. More specifically, distal end 5 may be lowered (i.e., in a negative Z-direction) through holes 6*a*, 7*a*, and 8*a*, respectively. During this process, stopper structure 3 (e.g., a flange) may prevent the probe from falling through guide plates 6, 7, and 8. As shown in FIG. 5(*a*), stopper structure 3 extends laterally beyond hole 7*a* and rests on a top surface of guide plate 7. As a result, upper portion 2 is unable to slide downwards (i.e., in a negative Z-direction) through hole 7*a*. As shown, the shape of hole 6*a* corresponds with the shape of the cross section of FIG. 2(*b*) (i.e., hole 6*a* is rectangular) and the shapes of holes 7*a* and 8*a* correspond with the shape of the cross section of FIG. 2(*c*) (i.e., holes 7*a* and 8*a* are square) or the shape of the cross section of FIG. 2(*d*) (i.e., holes 7*a* and 8*a* are rectangular).

As shown in FIG. 5(*b*), after the probe of FIGS. 1-2(*c*) is lowered into holes 6*a*, 7*a*, and 8*a*, upper plate 6 and lower plate 8 may be moved in opposing horizontal directions (e.g., upper plate 6 may be moved in a negative X-direction and lower plate 8 may be moved in a positive X-direction). The magnitude of the movements of upper plate 6 and lower plate 8 may differ or be approximately equal depending on the specific dimensions of the probe. The movement of the upper plate 6 and lower plate 8 in this manner will cause the probe to slant and/or curve around stopper structure 3. As shown, the probe is not perpendicular. Instead, it is tilted at an angle between approximately one and five degrees. Tilting the probe may advantageously increase the amount of friction between the probe and guide plates 6, 7, and/or 8. The increased friction may prevent the probe from falling out of the probe assembly of FIGS. 5(*a*)-(*b*) in the event that the probe assembly is inverted.

Figure 6:
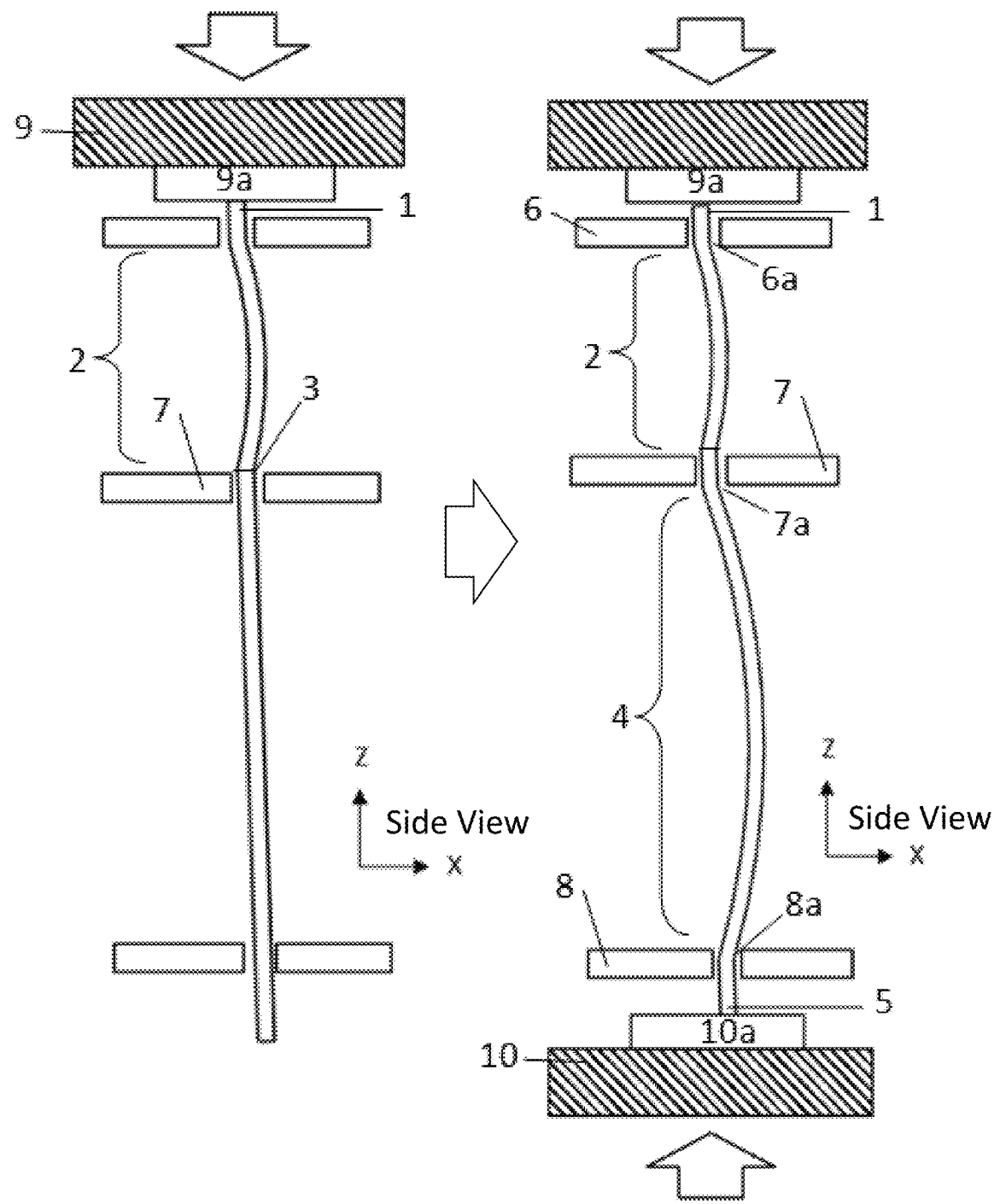
FIG. 6 illustrates the probe of FIG. 1 during a preload action and during an electrical test of a wafer.

FIG. 6 illustrates the probe of FIGS. 1-2(*c*) during a preload action and during an electrical test of a wafer 10. During the preload action, a PCB or space transformer 9 is lowered (i.e., in a negative Z-direction) towards the probe until proximal end 1 is placed into engagement with a contact pad 9*a* on PCB or space transformer 9. A first overdrive force may then be applied to PCB or space transformer 9 to lower it a further distance (e.g., a few more millimeters in a negative Z-direction). As shown, this overdrive force may cause upper portion 2 of the probe to deform. During an electrical test, wafer 10 is raised (i.e., in a positive Z-direction) towards the probe until distal end 5 is placed into engagement with a contact pad 10*a* on wafer 10. A second overdrive force may then be applied to wafer 10 to raise it a further distance (e.g., a few more millimeters in a positive Z-direction). As shown, this overdrive force may cause lower portion 4 of the probe to deform.

Figure 7:
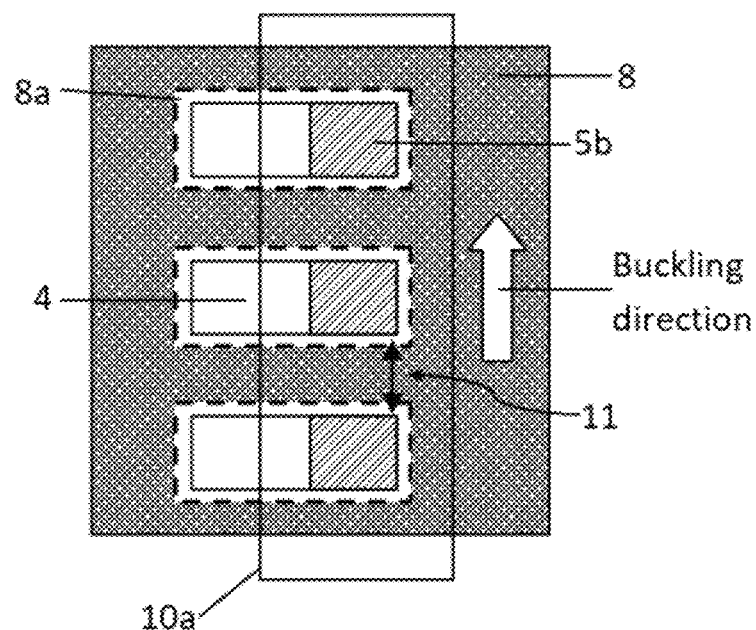
FIG. 7 is a bottom-up view from a wafer of three probes arranged linearly.
Figure 8A:
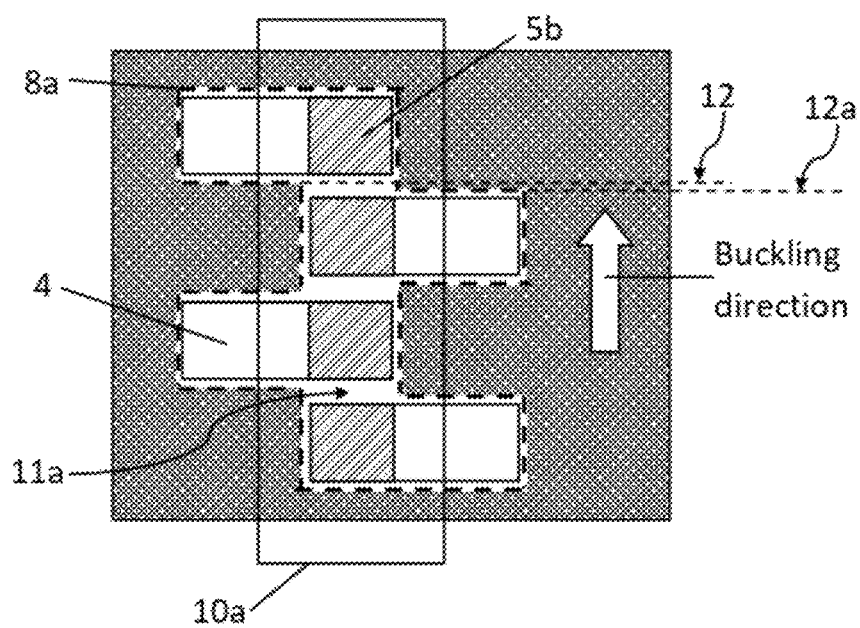
FIG. 8(a) is a bottom-up view from a wafer of four probes having a staggered formation.
Figure 8B:
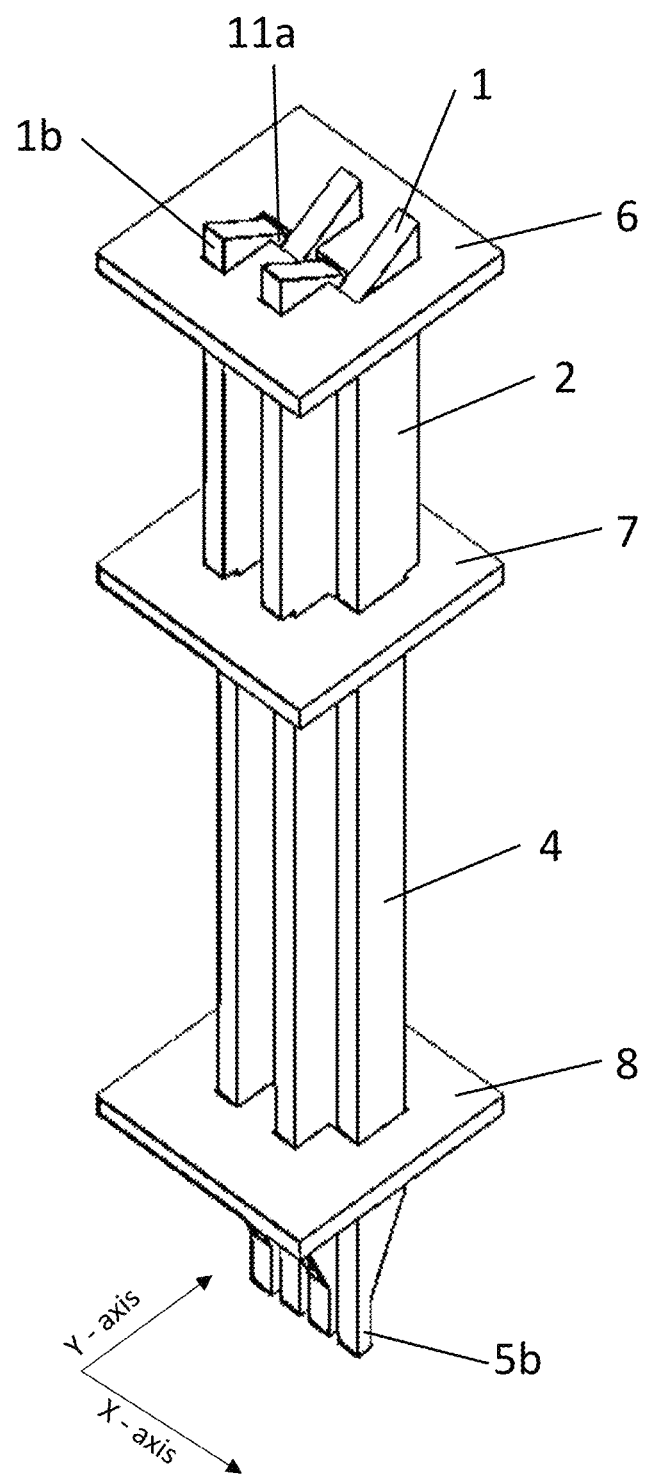
FIG. 8(b) is a perspective view of the four probes of FIG. 8(a) positioned in three guide plates when implemented with one of the tip designs of FIG. 4.
Figure 8C:
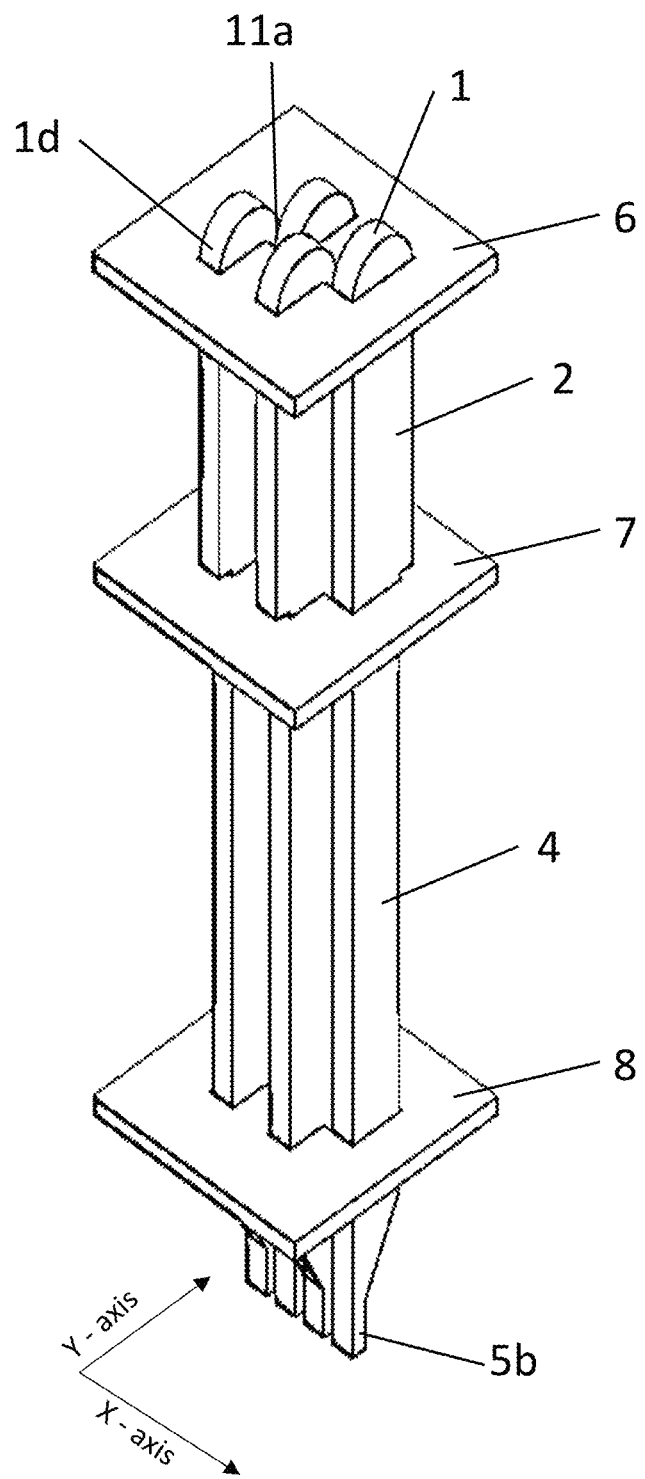
FIG. 8(c) is a perspective view of the four probes of FIG. 8(a) positioned in three guide plates when implemented with one of the tip designs of FIG. 4.
Figure 8D:
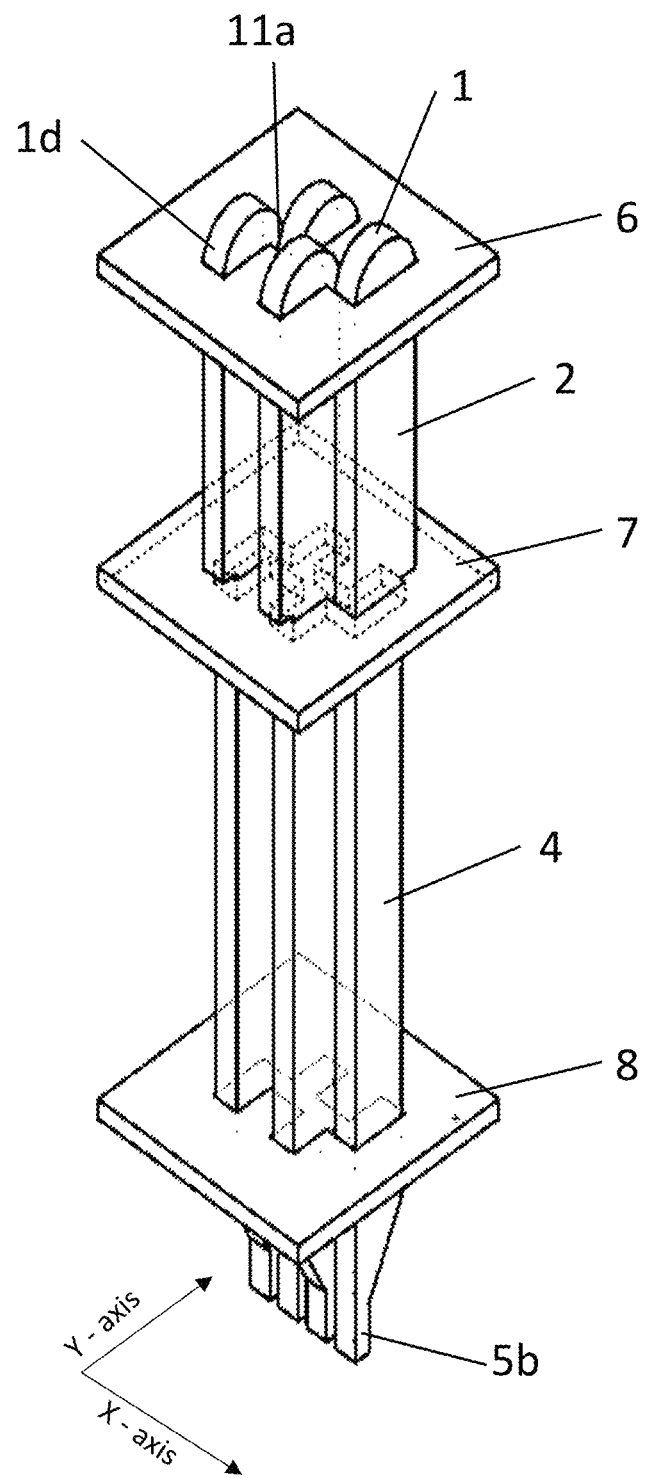
FIG. 8(d) is the same view shown in FIG. 8(c), but with the components illustrated transparently.
Figure 8E:
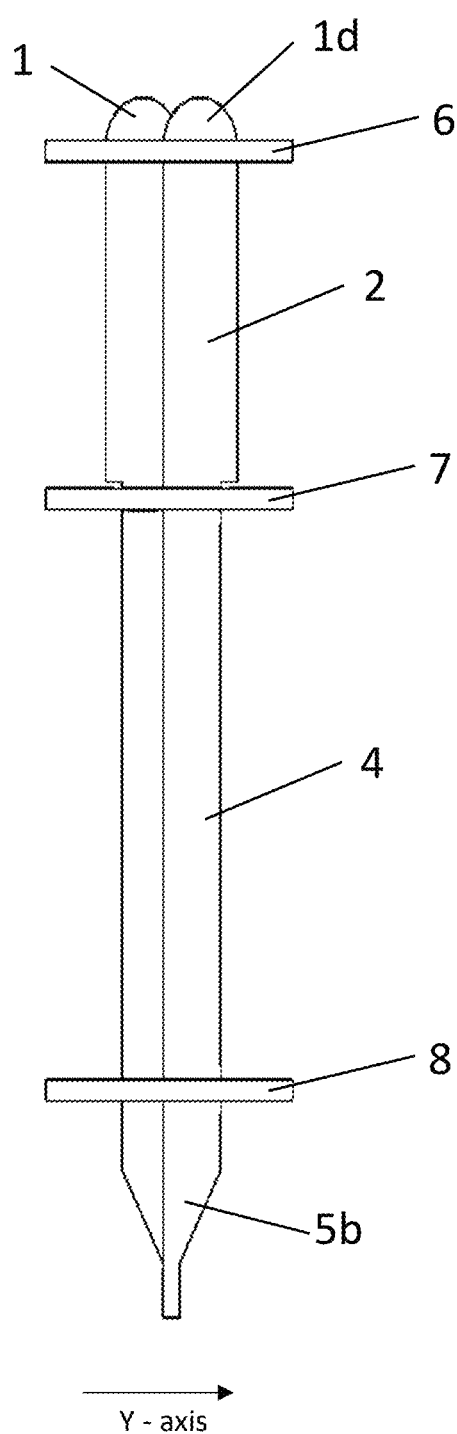
FIG. 8(e) is a side view of the arrangement shown in FIG. 8(c).
Figure 8F:
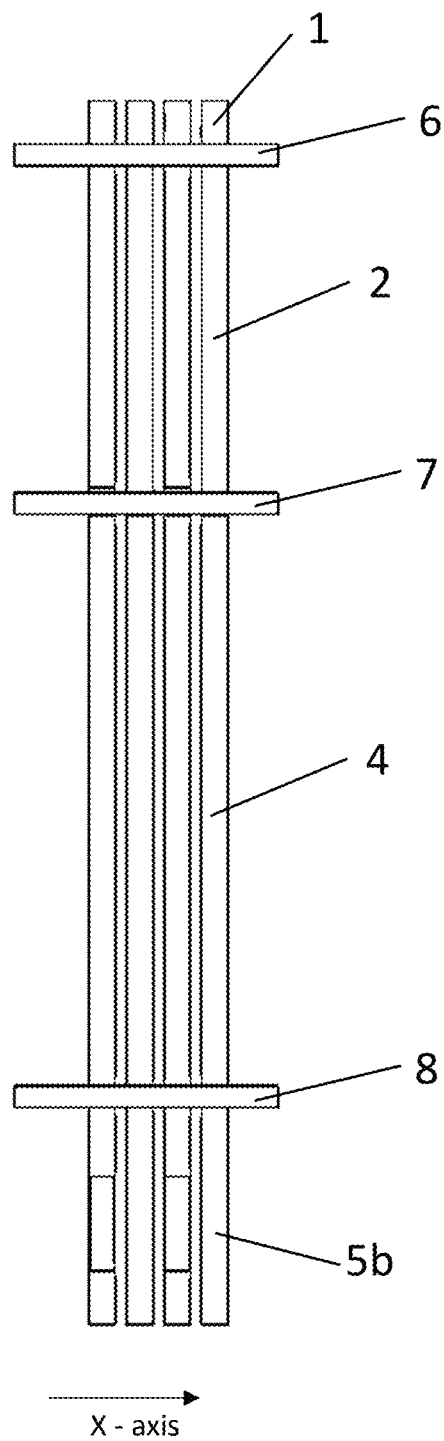
FIG. 8(f) is a side view of the arrangement shown in FIG. 8(c).

The probes described above in relation to FIGS. 1-6 can be arranged in a variety of different ways on guide plates. For example, FIG. 7 is a bottom-up view from a wafer of three probes arranged linearly. Each probe has a distal end 5*b* with an offset tip (see FIG. 4). Furthermore, each probe extends through a hole 8*a* of a lower guide plate 8 and is engaged with a contact pad 10*a* on a wafer. As shown, each hole 8*a* is rectangular. Furthermore, holes 8*a* are separated by a space 11. In some implementations, space 11 may be approximately equal to the minimum distance required to prevent the wall between holes 8*a* from collapsing under the stresses describe above in relation to, for example, FIG. 5(*b*). For example, depending on the material used to construct lower guide plate 8, space 11 may be approximately 20 um. Space 11 limits how closely the probes may be arranged relative to one another.

As another example, FIG. 8(*a*) is a bottom-up view from a wafer of four probes arranged in a single hole of a guide plate in a staggered formation. In contrast to the arrangement of FIG. 7, holes 8*a* have been joined together to form a single hole. Furthermore, the probes are staggered such that adjacent probes are oppositely oriented from one another (i.e., rotated 180 degrees relative to one another). To prevent the probes from contacting each other in this staggered formation, lines 12 and 12*a* cannot overlap. In other words, the walls of the single hole must be configured such that spaces 11*a* between the probes are maintained during operation. FIGS. 8(*b*)-8(*f*) provide perspective and side-views of the arrangement of FIG. 8(*a*).

Figure 9:
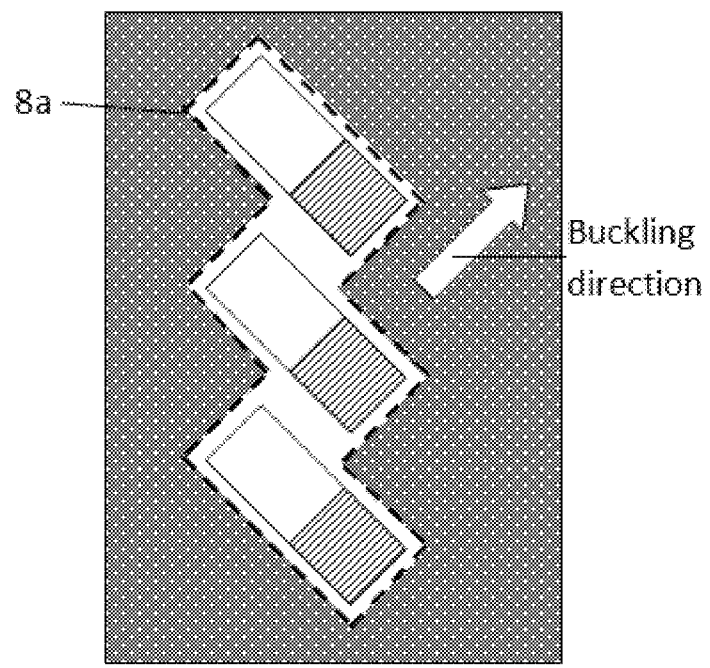
FIG. 9 is a bottom-up view from a wafer of three probes arranged diagonally.

As yet another example, FIG. 9 is a bottom-up view from a wafer of four probes arranged diagonally in a single hole of a guide plate. Much like the arrangement of FIG. 8(*a*), holes 8*a* have been joined together to form a single hole. Furthermore, the walls of this single hole must be configured such that the spaces between the probes are maintained during operation. However, due to the diagonal arrangement, the probes are all arranged in the same direction relative to one another.

Figure 10:
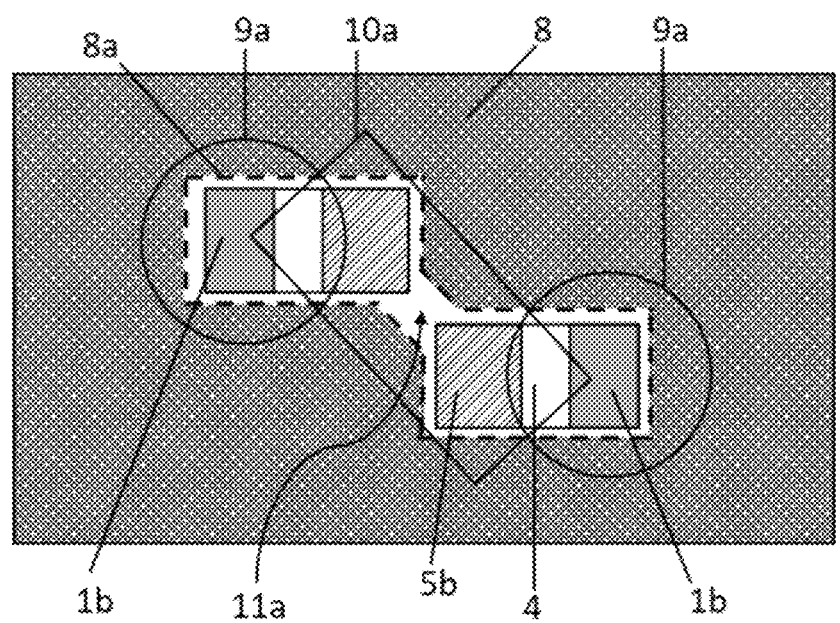
FIG. 10 is a bottom-up view from a wafer of two probes arranged diagonally.

As yet another example, FIG. 10 is a bottom-up view from a wafer of two probes arranged diagonally in a single hole of a guide plate. Much like the arrangements of FIGS. 8(*a*) and 9, holes 8*a* have been joined together to form a single hole. Furthermore, the walls of the single hole must be configured such that a space 11*a* between the probes is maintained during operation. However, in contrast to the arrangement of FIG. 9, rectangular holes 8*a* are joined through a pair of corners. Furthermore, in contrast to the arrangement of FIG. 9, the probes are oppositely oriented from one another. Advantageously, by positioning the probes in this manner, the pitch between contact pads 9*a* of PCB 9 may be increased.

In each of the arrangements of FIGS. 7-10, the corresponding probes are similarly structured. However, in some implementations, different types of probes may be used in a single probe assembly. For example, aside from the fact that the two probes are shaped differently, the arrangement illustrated in FIG. 11(*a*) is nearly identical to the arrangement of FIG. 10. As shown in FIG. 11(*b*), one of the probes has a proximal end 1*b* (see FIG. 4). As shown in FIG. 11(*c*), the other probe has a proximal end 1c (see FIG. 4). Advantageously, by using different types of probes in this manner, the pitch between contact pads 9b of PCB 9 may be further increased.

FIG. 12(a) illustrates a method for assembling and using a probe assembly in which the probes are tightly arranged. The probes and guide plates may be structured in much the same way as the probes and guide plates described above in relation to FIGS. 1-11(c). FIG. 12(b) is a bottom-up view from a wafer of the probes illustrated in FIG. 12(a) after assembly. As shown, the probe assembly of FIG. 12(a) includes two probes and guide places 6, 7, 8, and 13. Each probe includes a proximal end 1, an upper portion 2, a stopper structure 3 (e.g., a flange), a lower portion 4, and a distal end 5 with an offset tip. As shown, upper portions 2 of the probes are oriented in the same direction. However, lower portions 4 of the probes are oriented in opposite directions relative to one another. As shown, guide plate 6 includes a hole 6a, guide plate 7 includes a hole 7a, guide plate 8 includes a hole 8a and guide plate 13 includes a hole 13a.

During assembly, holes 6a, 7a, 8a, and 13a may be initially vertically aligned. Then the probes of FIG. 12(a) may be raised through holes 13a, 8a, 7a, and 6a. More specifically, proximal end 1 may be raised (i.e., in a positive Z-direction) through holes 13a, 8a, 7a, and 6a, respectively. In some implementations a cover (not shown) may be used during the processes described above to temporarily prevent the probes from falling through all of holes 6a, 7a, 8a, and 13a. In such embodiments, the cover may be positioned opposite the side through which the probes are being inserted. For example, if the probes are raised through holes 13a, then the cover may be positioned where a PCB (e.g., PCB 10) would be during testing.

Once stopper structure 3 is above a top surface of guide plate 7 and distal end 5 is below a bottom surface of guide plate 13, guide plates 7 and 8 may be moved in a horizontal direction to lock the probes in place. For example, as shown, after guide plates 7 and 8 are moved in a positive Y-direction, stopper structure 3 may rest on the top surface of guide plate 7. Furthermore, guide plates 6 and 13 prevent the probes from, for example, moving in a positive Y-direction and sliding out of the probe assembly. If a cover was used to position the probes, it may be removed after the probes have been secured. Afterwards, during testing, proximal ends 1 of the probes may be placed into engagement with contact pads 9a on PCB or space transformer 9, and distal ends 5 of the probes may be placed into engagement with contact pads 10a on wafer 10.

As shown in FIG. 12(b), the arrangement of FIG. 12(a) advantageously reduces an amount of space 11a between distal ends 5 of the probes by using offset tips and sliding guide plates. As noted above, it may be particularly advantageous to minimize the amount of space between the tips of the distal ends of the probes when a Kelvin test must be performed on a wafer. Furthermore, minimizing the amount of space between the tips of the distal ends of the probes may advantageously permit an increased number of probes to contact a wafer, thereby increasing the amount of current to be delivered to the wafer's contact pads.

Figure 13:
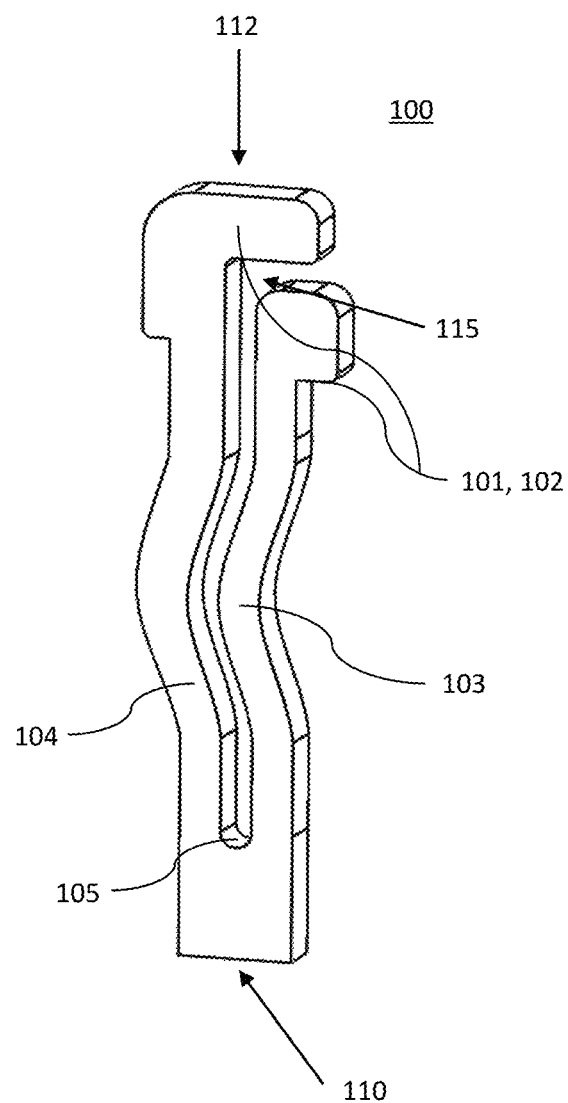
FIG. 13 illustrates a resilient probe according to one implementation.

As shown in FIG. 13, a probe 100 is configured as a monolithic or unitary structure having proximal 112 and distal 110 ends. The proximal end 112 is to be placed in contact with the contact pads 130 of a space transformer or PCB 125 (see, e.g., FIG. 14). The distal end 110 is to be placed in contact with the contact pads 140 on the wafer 135. The probe 100 has two fingers 103, 104 extending from the distal end 110 to the proximal end 112 of the probe. The two-fingered probe illustrated in FIG. 13 is just one example of the micromachined probes described herein. Probes with more than two fingers are contemplated herein.

In the probe illustrated in FIG. 13, each finger 103, 104 has a respective flange 102, 101. As illustrated in FIG. 13, the fingers 103, 104 form a junction 105 proximate the distal end 110 of the probe 100. The length of the fingers depends on the force required to cause the fingers to bend or buckle. The relative length of the fingers is selected to ensure that at least one of the fingers is longer than the others. The longer finger will be the initial physical contact between the probe and the PCB or space transformer contact. As the longer finger buckles or bends, the longer finger may make electrical contact with other fingers, creating a larger conductive pathway through the probe.

Figure 14:
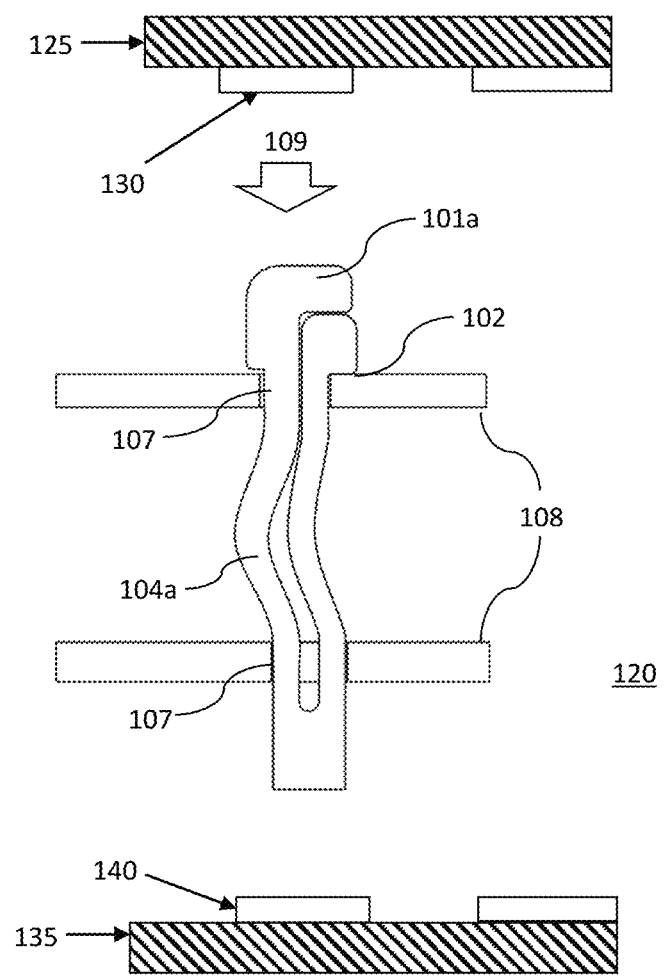
FIG. 14 is a cut-away side view of a probe assembly that illustrates the resilient probe disposed in the probe assembly and the response of the resilient probe to the contact force of the PCB or space transformer contact pad being brought into contact with the resilient probe illustrated in FIG. 13.

To allow the fingers to bend toward the other fingers in response to a compressive force, the fingers 103, 104 are separated by a gap 115. Referring to FIG. 14 for illustration, as a compressive force 109 is exerted on the proximal end 112 of finger 104, finger 104 begins to bend toward finger 103. The probe 100 is disposed in a probe assembly 120 that has a plurality of guide plates 108, as illustrated in FIG. 14. The probe 100 extends through holes 107 in the guide plates 108. The guide plates 108 can be formed of ceramic or silicon material. The holes in the guide plates can be formed by conventional methods such as laser drilling or photo-etching. As illustrated in FIG. 14, the probe 100 is freely supported in the probe assembly. As such, the probe is configured to ensure that it does not slip through holes 107 in the guide plates 108. Flange 102 extends through the hole 107 of the guide plate and rests on the surface of the guide plate 108 thereby ensuring that the probe 100 will not slip through the holes 107 in the guide plate 108 when freely supported in the probe assembly 120.

After the probe 100 is assembled into the guide plates 108 to form the probe assembly 120, the probe assembly is used to provide electrical contact between contact pads 130 on the PCB or space transformer 125, which is illustrated as being brought down (arrow 109) into contact with the longer finger 104, causing finger 104 to bend or buckle as illustrated at 104a. A constant force is therefore applied to contact pad 130 since finger 104 is resilient and therefore exerts an upward force in response to being deformed or buckled. The upward force from the resilient finger 104 provides continuous electrical contact between finger 104 and contact pad 130. The applied force improves the electrical contact between the tip 101a and the contact pad 130. The degree to which the finger 104 is buckled or deformed is largely a matter of design choice. The buckling distance can be in the range of about 1 mm or even larger. The distance can be in the range of about 10 um to 20 um or even larger. According to the present invention, even if the PCB or the space transformer is not entirely planar, all of the probes make contact with the contact pads, because all of the probes will buckle or bend independently, regardless of the extent to which the other probes buckle or bend.

Figure 15:
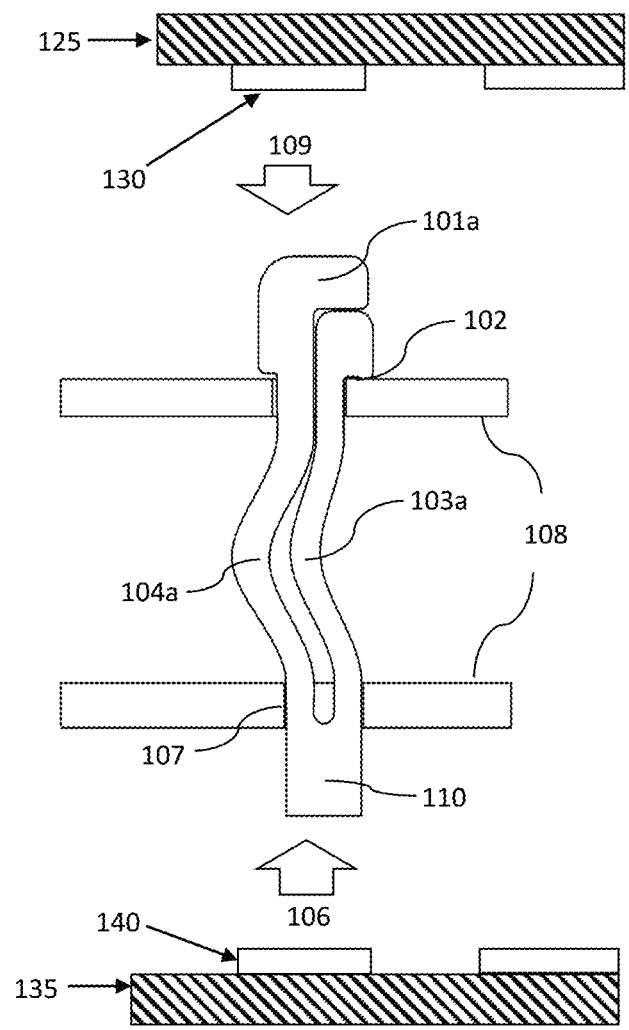
FIG. 15 is a cut-away side view of the probe assembly that illustrates the resilient probe disposed in a probe assembly and the response of the resilient probe to the contact force as the contact pad on the wafer or device under test is urged into contact with the resilient probe as illustrated in FIG. 13.

Referring to FIG. 15, during operation of testing of wafer or substrates, the wafer 135 having contacts 140 thereon that are brought into contact with the probe 100 at is distal end 110 (arrow 106). This additional force causes finger 103 to bend at 103a and also causes further bending or buckling of finger 104. As illustrated in FIG. 15, fingers 103 and 104 may bend or buckle into contact with each other. However, when such contact occurs, the conductive path provided by the probe increases providing less resistance to the flow of current therethrough.

Figure 16A:
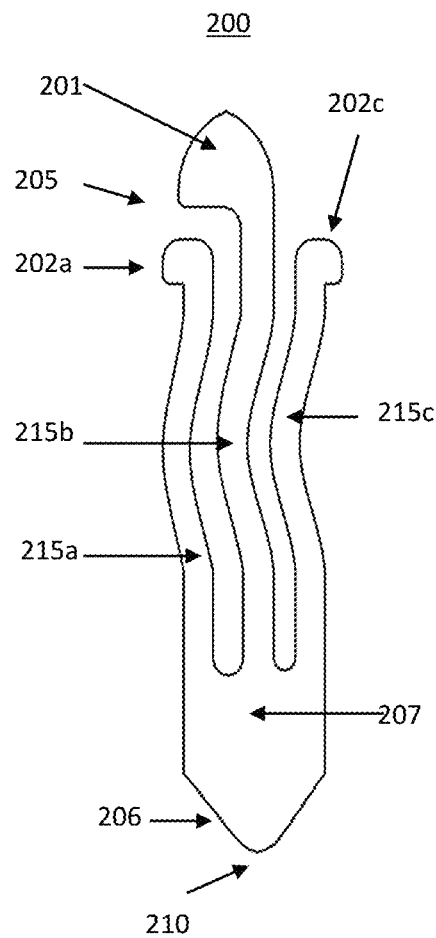
FIGS. 16(a)-(d) illustrates alternative resilient probe configurations.

As shown in FIGS. 16(a)-(d), the probe 100 can have many different configurations and certainly more than two fingers. Referring to FIG. 16(a), probe 200 has proximal end 205 and distal end 210. Probe 200 has three fingers, 215a, 215b and 215c. Finger 215b is the longer of the three fingers. Probe 200 has a proximal end tip 201 and a distal end tip 206. Distal end tip 206 is illustrated as lobed or curved, which is a desired configuration to penetrate any oxide that may have formed on the contact without exerting too much force or pressure on the contact. Probe 200 has a junction 207 from which the fingers 215a, 215b and 215c extend. Fingers 215a and 215c each have a flange 202a and 202c, respectively. As noted above, the flanges 202a, 202c ensure that the probe 200 will not slip through the guide plates (not shown) when held freely in the probe assembly (not shown).

Figure 16B:
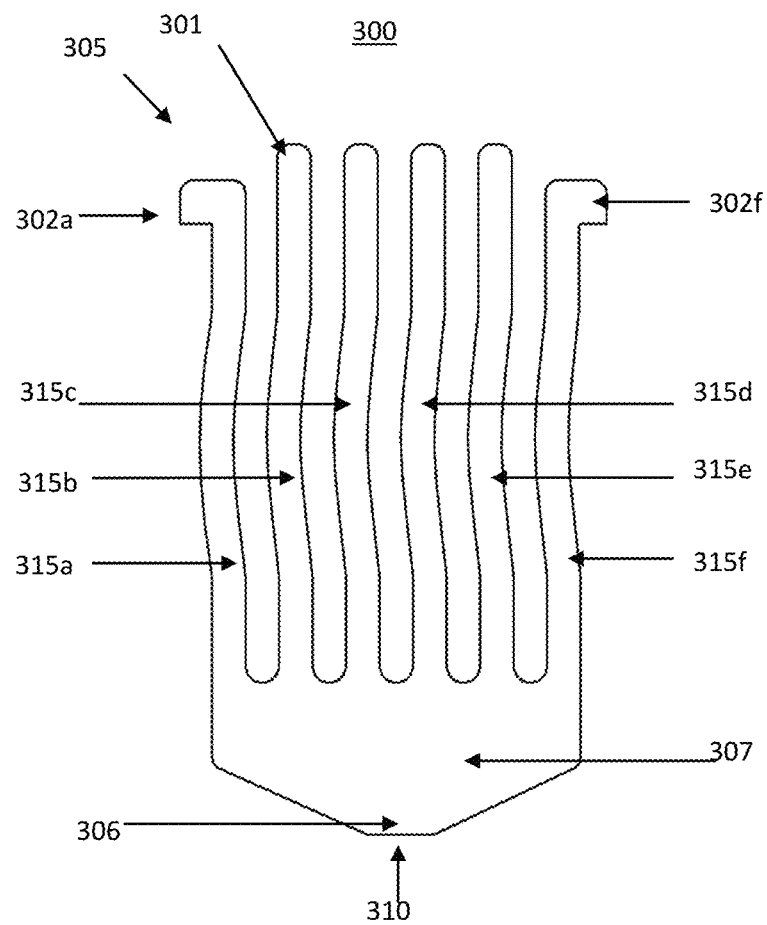

Referring to FIG. 16(b), probe 300 has proximal end 305 and distal end 310. Probe 300 has six fingers, 315a, 315b, 315c, 315d, 315e, and 315f. Fingers 315b, 315c, 315d, and 315e are the longer of the six fingers. Probe 300 has a proximal end tip 301 and a distal end tip 306. Distal end tip 306 is illustrated as tapered to a flat portion, which is a second desired configuration to penetrate any oxide that may have formed on the contact. Probe 300 has a junction 307 from which the fingers 315a-f extend. Fingers 315a and 315f each have a flange 302a and 302f, respectively. As noted above, the flanges 302a, 302f ensure that the probe 300 will not slip through the guide plates (not shown) when held freely in the probe assembly (not shown).

Figure 16C:
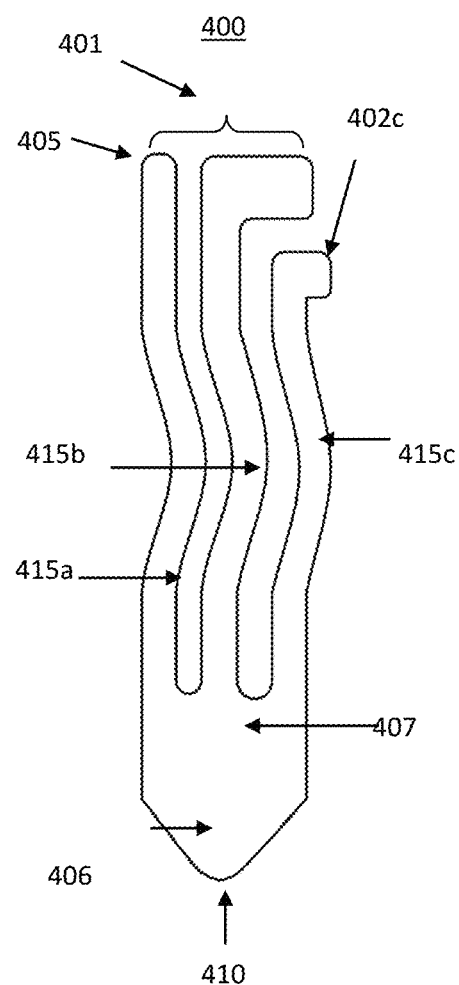

Referring to FIG. 16(c), probe 400 has proximal end 405 and distal end 410. Probe 400 has three fingers, 415a, 415b, and 415c. Fingers 415a and 415b are the longer of the three fingers. Probe 400 has a proximal end tip 401 and a distal end tip 406. Distal end tip 406 is illustrated as curved or lobed, which is a desired configuration to penetrate any oxide that may have formed on the contact, as noted above. Probe 400 has a junction 407 from which the fingers 415a-c extend. Finger 415c has a flange 402a. As noted above, the flange 402c, ensures that the probe 400 will not slip through the guide plates (not shown) when held freely in the probe assembly (not shown).

Figure 16D:
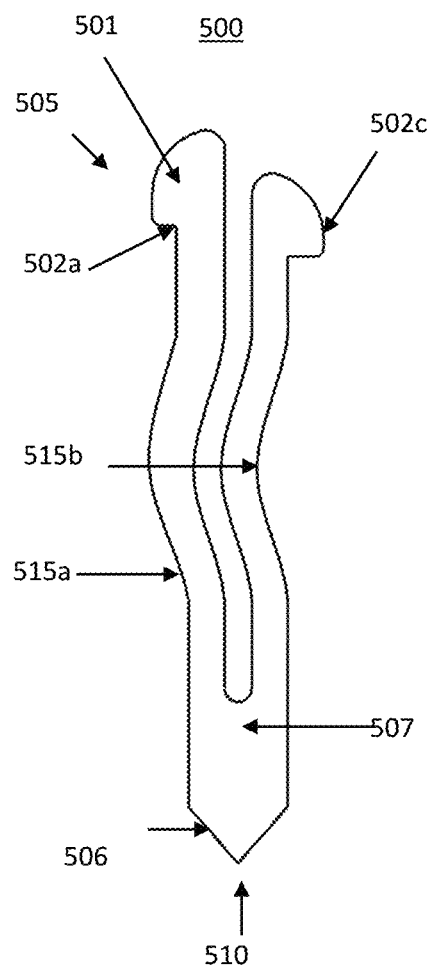

Referring to FIG. 16(d), probe 500 has proximal end 505 and distal end 510. Probe 500 has two fingers, 515a and 515b. Finger 515a is longer than finger 515b. Probe 500 has a proximal end tip 501 and a distal end tip 506. Distal end tip 506 is illustrated as pointed, which is a desired configuration to penetrate any oxide that may have formed on the contact. Probe 500 has a junction 507 from which the fingers 515a and 515b extend. Fingers 515a and 515b each have a flange 502a and 502b. As noted above, the flanges 502a and 502b ensure that the probe 500 will not slip through the guide plates (not shown) when held freely in the probe assembly (not shown). The probes are dimensioned to be resilient. FIGS. 16(a)-(d) illustrate different examples of possible probe shapes. The length of the probe will depend on the contact force required. The more fingers in the probe, the better compliance and the greater the amount of surface to contact the contact pad of the PCB or space transformer. The overall dimension of the probes can range from 2 mm×0.02 mm×0.02 mm (L×B×H) to 13 mm×0.3 mm×0.5 mm (L×B×H).

Figure 17:
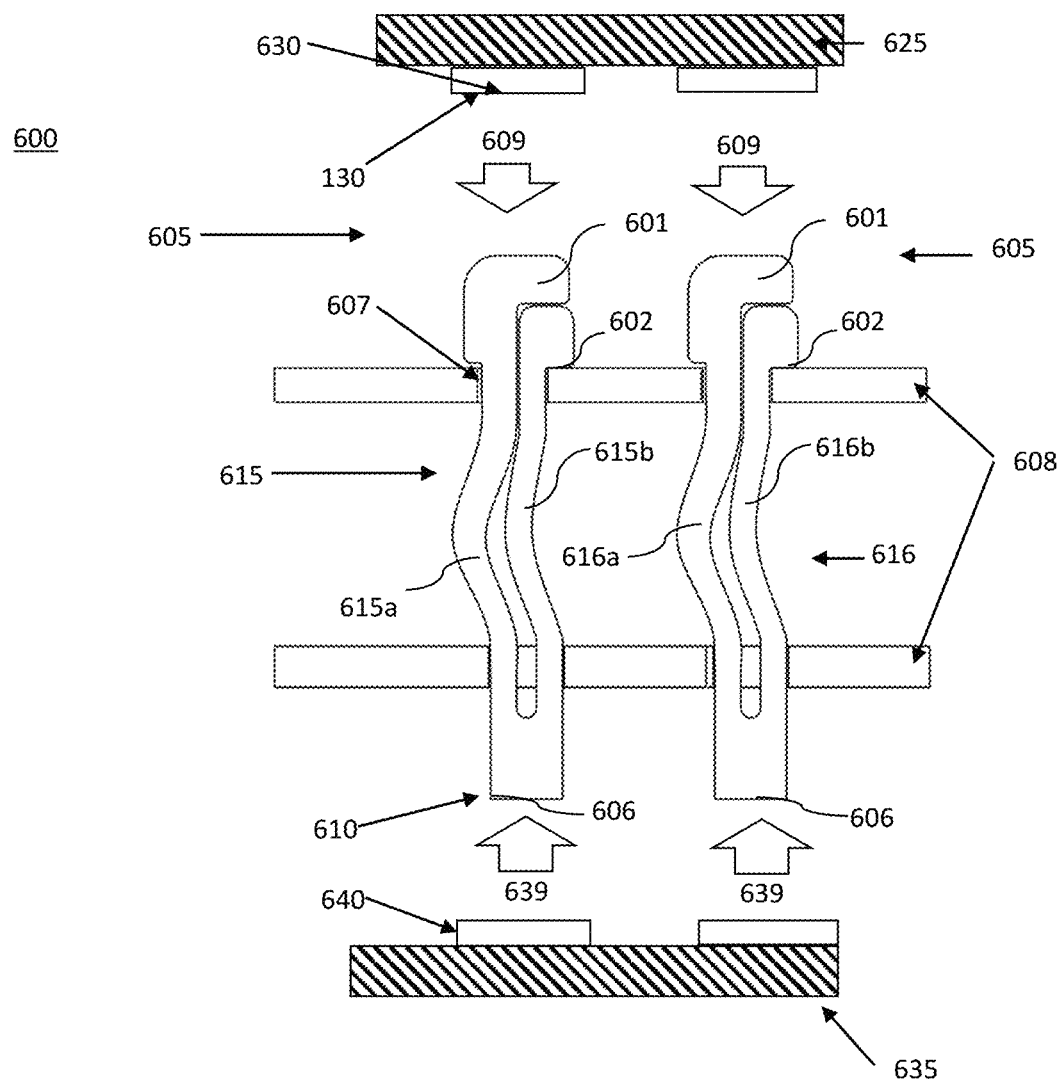
FIG. 17 is a cut-away side view of the probe assembly that illustrates multiple resilient probes disposed in the probe assembly with two guide plates.

As shown in FIG. 17, a probe assembly 600 includes two probes 615a and 615b. As describe above, during operation of testing of wafer or substrates, after the probes 615, 616 are assembled into the guide plates 608 to form the probe assembly 600, the probe assembly 600 is used to provide electrical contact between contact pads 630 on the PCB or space transformer 625, which is illustrated as being brought down (arrow 609) into contact with the longer finger 615a, 616a causing fingers 615a, 616a to bend or buckle as illustrated.

Regarding the guide plates themselves, the guide plates are configured to have an array of holes through which the probes are inserted. Each vertical array of holes defines a column in the probe assembly. As illustrated in FIG. 17, the probes 615 and 616 are disposed in holes 607 in guide plates 608. A constant force is therefore applied to contact pads 630 since fingers 615a, 616a are resilient and therefore exert an upward force in response to being deformed or buckled. The upward force from the resilient fingers 616a, 616b provide continuous electrical contact between fingers 615a, 616a and contact pads 630. As a result of the contact force, the tip 601 at the proximal end 605 of the probe 100 can scrape or penetrate any oxide on the surface of contact pad 630 or tip 601, which, as noted above, improves the electrical contact between the tip 601 and the contact pad 630. The degree to which the finger 615a, 616a are buckled or deformed is largely a matter of design choice. The buckling distance (i.e., the distance between the two ceramic guide plates 608) can be in the range of about 1 mm or even larger.

In the probe assembly described herein, even if the PCB or the space transformer is not planar, all of the probes make contact with the contact pads, because all of the probes will buckle or bend independently, regardless of the extent to which the other probes buckle or bend. Each probe 615, 616 has a flange 602. The flanges 602 hang over top guide plate 608, preventing the probes 615, 616 from slipping out of the probe assembly 600 when the probes 615, 616 are suspended freely within the probe assembly 600.

Subsequently, contacts 640 formed on the wafer or DUT are brought into contact with the probes 600 at the tips 606 at their distal end 610. This additional force 639 causes fingers 615b, 616b to bend and also further bends or buckles fingers 615a, 616a. As illustrated in FIG. 17, fingers 615a, 616a, may bend or buckle into contact with respective fingers 615b, 616b. This is not required. However, when such contact occurs, the conductive path provided by the probe increases providing less resistance to the flow of current therethrough.

The probes can be fabricated by means of laser cutting a metal foil or sheet. Additive manufacturing methods such as electroforming, covalent bonding and/or etching can also be used to form the patterned probes. When the probes are formed from planar sheets of metal, the probes can be fabricated on the flat surface of the probe lying horizontally. The probes may be one material or a composite of different materials. For example, layers of different materials can be deposited one upon the other. The materials are contemplated to be metals or metal alloys. Examples of suitable materials include silver-copper alloy, platinum +alloy (e.g., platinum alloyed with rhodium or some other suitable material), palladium alloy (e.g., palladium alloyed with nickel or some other suitable material), copper, gold, rhodium, nickel, nickel alloy (e.g., nickel alloyed with cobalt or manganese or other suitable material), graphene, carbon nano tubes, etc. Material selection will depend on the electrical and mechanical strength probe requirements. Probe bodies are coated with a layer of electrically insulated material such as acrylic, polyimides, parylene or any other electrical insulating materials. In some implementations, another layer of metal can be adhered to the probe bodies on one side after being coated with the layer of electrically insulated material. This will provide a ground plane feature to the probes by allowing higher operating frequency. That is, the probes will conduct the electrical signals from the wafer contacts to the PCB contacts at a higher speed. The additional layer of metal provides a ground plane on one side of the probe that is electrically isolated from the portion of the probe transmitting the signal. As such, the additional layer of metal allows the probe to operate at significantly higher frequencies. For example, a probe that transmits signals at a frequency of 800 MHZ (at, for example, −1 dB) can operate at a frequency of 1.2 GHz (at the same −1 dB or so).

In one implementation, at least one of the probe fingers is slightly curved. The amount of curvature is largely a matter of design choice and is selected to reduce the amount of force required to cause the probe to bend or buckle and controls the location and extent of the buckling. The extent of the bend supports resilient buckling (i.e., the probe returns to its original shape when the force is removed therefrom).

When the probes are held vertically by the guide plates, the probes extend from both the top guide plate and the bottom guide plate to allow the probes to be placed in electrical contact with the contacts on the PCB or space transformer (i.e., the contacts that will be engaged by a probe finger) and the contacts on the wafer or DUT (i.e., the contacts that will be engaged by the distal, not fingered, portion of the probe). In some implementations, the probes may include non-electrically conductive insulation. The thickness of the non-electrically conductive insulation on the probe permits the probe to fit within the holes in the guide plate. A stopper structure (e.g., flange 602) prevents the portion of the probe that extends beyond the non-conductive insulation in the direction of the lower plate 608 from advancing more than a predetermined distance beyond lower plate 608.

The probes are dimensioned such that they provide a sufficient amount of conductance for the probe assembly. The amount of conductance required for a specific apparatus is largely a matter of design choice and is not discussed in detail herein. The probes are dimensioned to be resilient. As described in detail herein, the apparatus allows for the probes to bend as either the PCB/space transformer or a test wafer is advanced into contact with the probes for testing. After testing, when the PCB/space transformer or test wafer is removed from contact with the probe, the probe(s) relax to its original shape.

The PCB or space transformer is brought into contact with the probes. The probe assembly is fastened to the space transformer or PCB 625 with screws (not shown) or bolts or other conventional fastening mechanisms well known to the skilled person. The screws or bolts fasten PCB 625 with top guide plate 608. The lower guide plate 608 is not so fastened. When the probes need to be replaced, the probe assembly can be taken apart by removing the screws or bolts and separating the probe assembly from the transformer or PCB.

Described herein is a vertical probe assembly comprising a first resilient compliant probe formed from a conductive material, the first probe comprising an upper portion, a lower portion, and a stopper structure positioned between the upper and lower portions of the first probe; a first guide plate having a first hole; a second guide plate having a second hole, the second guide plate being positioned beneath the first guide plate; and a third guide plate having a third hole, the third guide plate being positioned beneath the first and second guide plates, wherein the first, second, and third guide plates are formed from a non-conductive substrate and separated by one or more spacers, wherein the first, second, and third holes are vertically aligned, and wherein the first probe is positioned within the first, second, and third holes such that the upper portion extends through the first hole, the lower portion extends through the second and third holes, and the stopper structure contacts a surface of the second guide plate that faces the first guide plate.

In one aspect, the vertical probe assembly has a stopper structure that is a flange that extends laterally beyond the second hole. In another aspect a tip of the first probe is offset. In another aspect the tip of the first probe is symmetrical.

In yet another aspect, the upper and lower portions of the first probe are configured to separately deform in response to external forces being applied to proximal and distal ends of the first probe. In a further aspect the upper and lower portions of the first probe have square or rectangular cross sections.

In another aspect, a second resilient compliant probe that extends through the first, second, and third holes without contacting the first probe. In yet another aspect, the first resilient compliant probe and the second resilient compliant probe each comprise a distal end for contacting a wafer during electrical testing of the wafer, and wherein the distal ends of the first and second probes are oppositely oriented. In another aspect, the lower portion of the first probe is curved.

In another aspect the vertical probe assembly described above has a fourth guide plate having a fourth hole, the fourth guide plate being positioned beneath the first, second, and third guide plates. In one aspect, the fourth guide plate is formed from a non-conductive substrate and separated from the third guide plate by one or more spacers, and the fourth hole is vertically aligned with the first, second, and third holes. In a further aspect the lower portion of the first probe extends through the fourth hole, and at least two of the first, second, third, and fourth guide plates are configured to slide horizontally to release or secure the first probe.

Also described is a probe assembly having at least two guide plates, each guide plate formed from a non-conductive substrate, the guide plate having a first and second surface with an array of holes extending from the first surface to the second surface, the holes of the guide plates align to receive therethrough a resilient compliant probe, the resilient compliant probe having a proximal end and a distal end, the proximal and distal ends extending beyond the holes of the guide plates, wherein the probes have a pattern comprising a plurality of fingers at the proximal end, wherein at least a first finger is longer than a second finger, the probe further comprising a junction from which the fingers extend toward the proximal in the probe, wherein the distal end of the probe does not have fingers.

In one aspect, the fingers of the probe assembly are curved. In a further aspect at least one finger has a stopper structure that prevents an entirety of the probe from passing through the hole in the guide plate in which the probe is received. In a further aspect, the resilient compliant probe is formed from a conductive material and composite conductive materials, the conductive materials selected from the group consisting of silver-copper alloy, platinum alloy, palladium alloy, copper, gold, rhodium, nickel, nickel alloy, graphene, and carbon nanotube. In another aspect, the first guide plate and the second guide plate are fixed in position.

The probe assembly may be operated by bringing a plurality of contacts disposed on a printed circuit board or space transformer into engagement with a corresponding plurality of the resilient compliant probes, wherein a force of contact causes at least the longer finger of the probe to bend in response to the force exerted thereon by the printed circuit board.

From the foregoing and with reference to the various figure drawings, those skilled in the art will appreciate that certain modifications can also be made to the present disclosure without departing from the scope of the same. While several implementations of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of particular implementations. Those skilled in the art will envision other modifications within the scope and spirit of the claims appended hereto.

The invention claimed is:

1. A vertical probe assembly comprising:
a resilient compliant probe formed from a conductive material, the probe comprising an upper portion, a lower portion, and a resilient stopper structure positioned between the upper and lower portions of the probe;
a first guide plate having a first hole;
a second guide plate having a second hole, the second guide plate being positioned beneath the first guide plate; and
a third guide plate having a third hole, the third guide plate being positioned beneath the first and second guide plates,
wherein the first, second, and third guide plates are formed from a non-conductive substrate and separated by one or more spacers,
wherein the first, second, and third holes are vertically aligned to receive the probe therethrough,
wherein the upper and lower portions of the probe are non-coaxial and parallel to one another, and
wherein the probe is positioned within the first, second, and third holes such that the upper portion extends through the first hole, the lower portion extends through the second and third holes, and the stopper structure contacts a surface of the second guide plate that faces the first guide plate,
wherein the first and third guide plates are configured to move in opposing horizontal directions to tilt the probe after it has been received in the vertically aligned holes, and
wherein the upper and lower portions of the probe are configured to separately deform around the resilient stopper in response to sliding the first and third guide plates in opposing horizontal directions to tilt the probe.

2. The vertical probe assembly of claim 1, wherein the resilient stopper structure is a flange that extends laterally beyond the second hole.

3. The vertical probe assembly of claim 1, wherein a tip of the probe is offset.

4. The vertical probe assembly of claim 1, wherein a tip of the probe is symmetrical.

5. The vertical probe assembly of claim 1, wherein the upper and lower portions of the probe have rectangular cross sections.

6. The vertical probe assembly of claim 1, further comprising:
a fourth guide plate having a fourth hole, the fourth guide plate being positioned beneath the first, second, and third guide plates,
wherein the fourth guide plate is formed from a non-conductive substrate and separated from the third guide plate by one or more spacers,
wherein the fourth hole is vertically aligned with the first, second, and third holes,
wherein the lower portion of the probe extends through the fourth hole, and
wherein at least two of the first, second, third, and fourth guide plates are configured to slide horizontally to release or secure the probe.

7. The vertical probe assembly of claim 1, wherein the upper portion of the probe is straight.

8. The vertical probe assembly of claim 7, wherein the lower portion of the probe is straight or bent.

9. The vertical probe assembly of claim 1, wherein aside from a proximal tip, the upper portion of the probe has a uniform cross-section.

10. The vertical probe assembly of claim 9, wherein aside from a distal tip, the lower portion of the probe has a uniform cross-section.

11. The vertical probe assembly of claim 10, wherein the upper and lower portions of the probe are straight.

12. The vertical probe assembly of claim 10, wherein the upper portion of the probe is straight, and wherein the lower portion of the probe is bent.

13. The vertical probe assembly of claim 5, wherein the upper and lower portions of the probe are configured such that the deformation of these portions is limited to two opposing directions.

14. The vertical probe assembly of claim 1, wherein the upper portion of the probe is shorter than the lower portion.

15. The vertical probe assembly of claim 1, wherein moving the first and third guide plates in opposing horizontal directions increases an amount of friction between the probe and the first, second, and third guide plates.

16. A vertical probe assembly comprising:
a first resilient compliant probe formed from a conductive material, the first probe comprising an upper portion, a lower portion, and a stopper structure positioned between the upper and lower portions of the first probe;
a first guide plate having a first hole;
a second guide plate having a second hole, the second guide plate being positioned beneath the first guide plate;
a third guide plate having a third hole, the third guide plate being positioned beneath the first and second guide plates; and
a second resilient compliant probe that extends through the first, second, and third holes without contacting the first resilient compliant probe,
wherein the first, second, and third guide plates are formed from a non-conductive substrate and separated by one or more spacers,
wherein the first, second, and third holes are vertically aligned, and
wherein the first probe is positioned within the first, second, and third holes such that the upper portion extends through the first hole, the lower portion extends through the second and third holes, and the stopper structure contacts a surface of the second guide plate that faces the first guide plate.

17. The vertical probe assembly of claim 16, wherein the first resilient compliant probe and the second resilient compliant probe each comprise a distal end for contacting a wafer during electrical testing of the wafer, and wherein the distal ends of the first and second probes are oppositely oriented.

* * * * *